(12) United States Patent
Morioka et al.

(10) Patent No.: US 9,287,168 B2
(45) Date of Patent: Mar. 15, 2016

(54) SEMICONDUCTOR DEVICE AND PROCESS FOR PRODUCING THE SAME

(71) Applicant: FUJITSU SEMICONDUCTOR LIMITED, Yokohama-Shi, Kanagawa (JP)

(72) Inventors: Hiroshi Morioka, Kawasaki (JP); Jusuke Ogura, Kawasaki (JP); Sergey Pidin, Kawasaki (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/259,186

(22) Filed: Apr. 23, 2014

(65) Prior Publication Data

US 2014/0227873 A1   Aug. 14, 2014

Related U.S. Application Data

(62) Division of application No. 11/649,269, filed on Jan. 4, 2007, now Pat. No. 8,749,062.

(30) Foreign Application Priority Data

Mar. 3, 2006   (JP) .................................. 2006-058429

(51) Int. Cl.
*H01L 21/44*   (2006.01)
*H01L 21/768*   (2006.01)
(Continued)

(52) U.S. Cl.
CPC .. *H01L 21/76877* (2013.01); *H01L 21/823807* (2013.01); *H01L 21/823864* (2013.01); *H01L 21/823871* (2013.01); *H01L 29/7843* (2013.01); *H01L 2924/0002* (2013.01)

(58) Field of Classification Search
CPC .................................................. H01L 21/76877
USPC .......................................................... 438/667
See application file for complete search history.

(56) References Cited

U.S. PATENT DOCUMENTS 6,602,746 B2   8/2003   Tanaka
7,105,394 B2   9/2006   Hachimine et al.
(Continued)

FOREIGN PATENT DOCUMENTS

JP   2003-273240 A   9/2003
JP   2004-023047     1/2004
(Continued)

OTHER PUBLICATIONS

"JP Official Action", mailed by JPO and corresponding to Japanese application No. 2006-058429 on May 10, 2011, with partial English translation.
(Continued)

*Primary Examiner* — Matthew Landau
*Assistant Examiner* — Igwe U Anya
(74) *Attorney, Agent, or Firm* — Fujitsu Patent Center

(57) ABSTRACT

A semiconductor device having a contact structure is provided. The semiconductor device includes: a conductive region; a first film and a second film which are formed over the conductive region to realize a layer; and a contact electrode which extends through the layer to the conductive region, and is formed so as to replace a portion of the layer with a portion of the contact electrode, where the portion of the layer is constituted by only the first film, only the second film, or both of a portion of the first film and a portion of the second film, and the portion of the first film occupies a major part of the portion of the layer.

3 Claims, 45 Drawing Sheets

(51) Int. Cl.
*H01L 21/8238* (2006.01)
*H01L 29/78* (2006.01)

(56) References Cited

U.S. PATENT DOCUMENTS

| | | | |
|---|---|---|---|
| 2005/0032316 A1 | 2/2005 | Tang et al. | |
| 2005/0073011 A1 | 4/2005 | Taguwa | |
| 2005/0141268 A1 | 6/2005 | Ahn | |
| 2005/0263825 A1 | 12/2005 | Frohberg et al. | |
| 2005/0266639 A1 | 12/2005 | Frohberg et al. | |
| 2005/0285137 A1* | 12/2005 | Satoh | 257/178 |
| 2006/0003510 A1 | 1/2006 | Kammler et al. | |
| 2006/0091471 A1 | 5/2006 | Frohberg et al. | |
| 2006/0228836 A1* | 10/2006 | Yang et al. | 438/149 |
| 2006/0281240 A1 | 12/2006 | Grudowski et al. | |
| 2007/0045747 A1* | 3/2007 | Kohyama | 257/365 |
| 2007/0099360 A1* | 5/2007 | Lee et al. | 438/197 |
| 2007/0105299 A1 | 5/2007 | Fang et al. | |
| 2007/0108526 A1 | 5/2007 | Kohyama | |
| 2007/0138564 A1 | 6/2007 | Lim et al. | |
| 2007/0145522 A1* | 6/2007 | Oishi | 257/510 |
| 2007/0158721 A1 | 7/2007 | Akamatsu | |
| 2007/0181951 A1 | 8/2007 | Chen et al. | |
| 2007/0187727 A1 | 8/2007 | Ting et al. | |
| 2007/0200179 A1 | 8/2007 | Chen | |
| 2007/0284617 A1 | 12/2007 | Doris et al. | |
| 2007/0296027 A1* | 12/2007 | Yang et al. | 257/327 |
| 2008/0054366 A1 | 3/2008 | Pidin | |

FOREIGN PATENT DOCUMENTS

| | | |
|---|---|---|
| JP | 2005-57301 | 3/2005 |
| JP | 2005-322730 A | 11/2005 |
| JP | 2006-80161 | 3/2006 |
| JP | 2006-173432 | 6/2006 |
| JP | 2007-088452 A | 4/2007 |
| JP | 2007-173466 A | 7/2007 |
| JP | 2009-520363 A | 5/2009 |
| WO | 2007/097814 | 8/2007 |

OTHER PUBLICATIONS

USPTO, (ANYA) Notice of Allowance and Notice of Allowability, Feb. 7, 2014, in parent U.S. Appl. No. 11/649,269 [allowed].
USPTO, (ANYA) Non-Final Rejection, Jun. 26, 2013, in parent U.S. Appl. No. 11/649,269 [allowed].
USPTO, (ANYA) Final Rejection, Apr. 15, 2011, in parent U.S. Appl. No. 11/649,269 [allowed].
USPTO, (ANYA) Non-Final Rejection, Sep. 27, 2010, in parent U.S. Appl. No. 11/649,269 [allowed].
USPTO, (ANYA) Non-Final Rejection, Mar. 29, 2010, in parent U.S. Appl. No. 11/649,269 [allowed].
USPTO, (ANYA) Restriction Requirement, Dec. 30, 2009, in parent U.S. Appl. No. 11/649,269 [allowed].

* cited by examiner

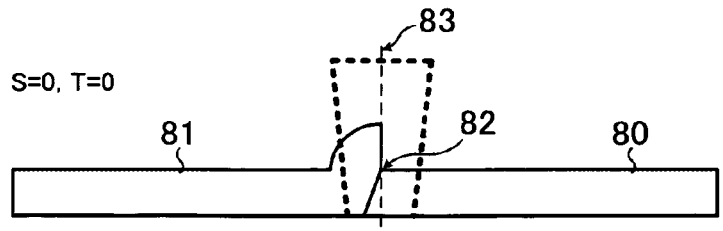
FIG. 18A
FIG. 18B
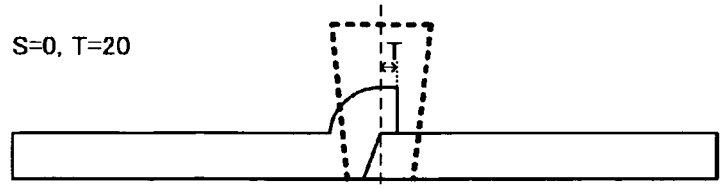
FIG. 18C
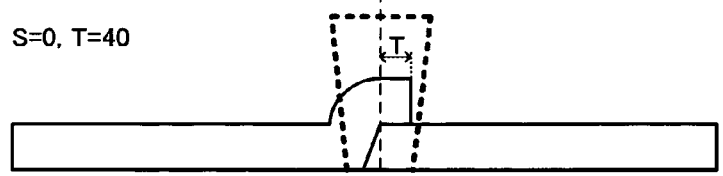
FIG. 18D
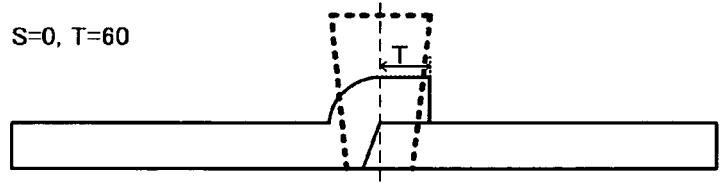
FIG. 18E
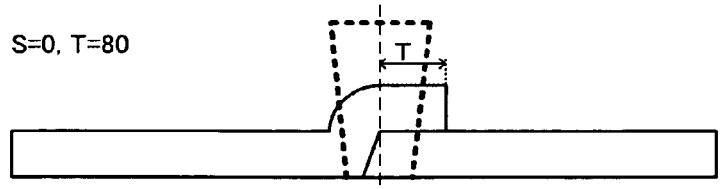
FIG. 18F
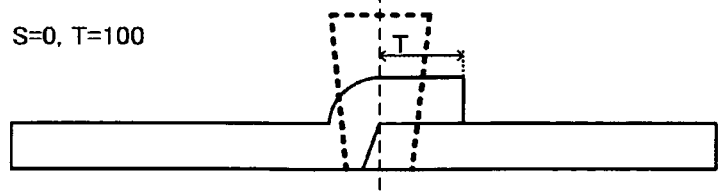

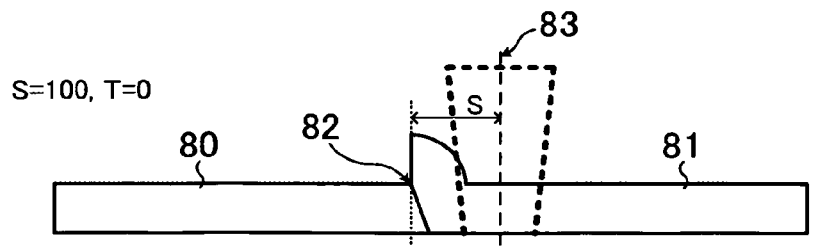
FIG. 25A
FIG. 25B
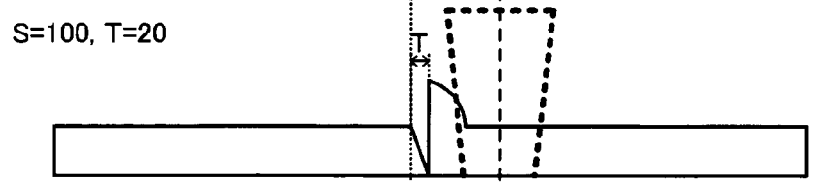
FIG. 25C
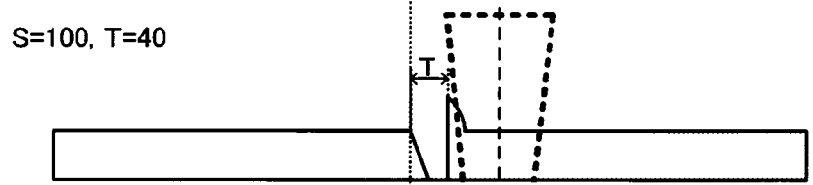
FIG. 25D
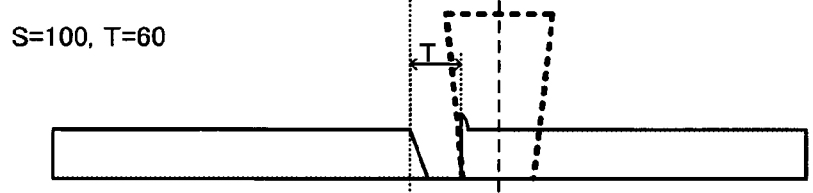
FIG. 25E
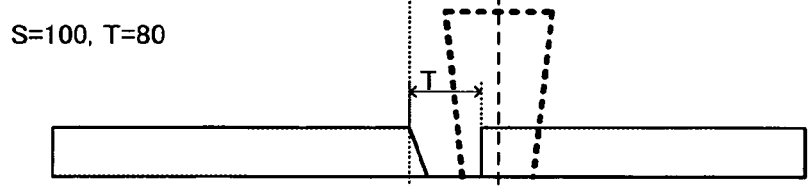
FIG. 25F

SEMICONDUCTOR DEVICE AND PROCESS FOR PRODUCING THE SAME

CROSS-REFERENCE TO RELATED APPLICATIONS

This application is a divisional of application Ser. No. 11/649,269, filed Jan. 4, 2007, which is based upon and claims the benefits of priority from the prior Japanese Patent Application No. 2006-058429, filed on Mar. 3, 2006, the entire contents of which are incorporated herein by reference.

BACKGROUND OF THE INVENTION

1) Field of the Invention

The present invention relates to a semiconductor device having an interlayer contact structure, and to a process for producing the semiconductor.

2) Description of the Related Art

In the complementary MOS (Metal Oxide Semiconductor) field effect transistors (CMOSs) constituted by an n-channel MOS field effect transistor (nMOS) and a p-channel MOS field effect transistor (pMOS), it is desirable to increase the carrier mobility in each of the nMOS and pMOS transistors in order to speed up the nMOS and pMOS transistors.

According to a conventional technique for increasing the carrier mobility, silicongermanium (SiGe) is used in a layer underlying a Si-channel region, or in source and drain regions sandwiching the Si-channel region. In another conventional technique (disclosed, for example, in Japanese Unexamined Patent Publication No. 2005-057301), predetermined films (for example, films having predetermined thicknesses or predetermined areas) are formed over transistors so as to apply stresses to channel regions in the transistors, where the stresses are determined according to the predetermined films.

Generally, tensile stress in the channel region is effective in increasing the mobility of electrons, and compressive stress in the channel region is effective in increasing the mobility of positive poles. In the CMOSs structures, the carrier mobility in the nMOS substructure (e.g., nMOS transistor) and the pMOS substructure (e.g., pMOS transistor) can be respectively increased by forming a film which applies tensile stress to the nMOS substructure, and a film which applies compressive stress to the pMOS substructure.

However, in the structures in which films (stressing films) for respectively applying predetermined stresses to channel regions in the nMOS substructure and the pMOS substructure are formed, problems occur as explained below.

Before the problems are indicated, a process for forming different stressing films over the nMOS substructure and the pMOS substructure constituting a CMOS converter circuit (as an example of a semiconductor device constituted by an nMOS substructure and a pMOS substructure) is explained below.

FIGS. 35 to 41 are schematic cross-sectional views of an essential portion of a CMOS structure, and presented for showing an example of a process for forming stressing films, where FIG. 35 shows the essential portion in a stage before formation of the stressing films, FIG. 36 shows a stage in which a first etching stopper film is formed, FIG. 37 shows a stage in which a first stressing film and a second etching stopper film are formed, FIG. 38 shows a first etching stage, FIG. 39 shows a stage in which a second stressing film and a third etching stopper film are formed, FIG. 40 shows a second etching stage, and FIG. 41 shows a stage in which an interlayer insulation film is formed.

In the first stage in the process for forming the stressing films, as illustrated in FIG. 35, the CMOS structure 100 containing an nMOS substructure 120 and a pMOS substructure 130 is formed as a basic structure on a Si substrate 101. In the CMOS structure 100, element isolation of the nMOS substructure 120 and the pMOS substructure 130 is realized by the trenches 102 arranged for shallow trench isolation (STI). In the Si substrate 101, a p-well 121 is formed in the vicinity of the nMOS substructure 120, and an n-well 131 is formed in the vicinity of the pMOS substructure 130. The boundary between the p-well 121 and the n-well 131 is located approximately in the middle between the nMOS substructure 120 and the pMOS substructure 130.

A gate electrode 104 common to the nMOS substructure 120 and the pMOS substructure 130 is arranged over the nMOS substructure 120 and the pMOS substructure 130 through a gate insulation film 103, and side walls (not shown) are formed on the sides of the gate electrode 104. In addition, source and drain regions (not shown) are formed in the Si substrate 101 on both sides of the gate electrode 104. Further, a region 105 of a silicide of cobalt (Co), nickel (Ni), titanium (Ti), or the like is formed over the gate electrode 104. Although not shown, silicide regions are also formed over the source and drain regions as well as the gate electrode 104.

After the CMOS structure 100 having the above basic structure of FIG. 35 is formed, a film of silicon oxide ($SiO_2$) having a thickness of approximately 10 nm is formed as the first etching stopper film 106 by using TEOS (tetraethylorthosilicate), as illustrated in FIG. 36.

Then, as illustrated in FIG. 37, a film of silicon nitride (SiN) being designed for application of tensile stress and having a thickness of approximately 80 nm is formed as the first stressing film 107 over the layered structure of FIG. 36. In addition, a film of $SiO_2$ or the like having a thickness of approximately 20 nm is formed as the second etching stopper film 108 on the first stressing film 107. The second etching stopper film 108 is used as a hard mask in the first etching step, which is explained later. Alternatively, it is possible to dispense with the formation of the second etching stopper film 108.

After the first stressing film 107 and the second etching stopper film 108 are formed, in the first etching step, a portions of the first stressing film 107 and a portions of the second etching stopper film 108 formed over the pMOS substructure 130 are removed by etching. After the first etching step, the first stressing film 107 and the second etching stopper film 108 remain over only the nMOS substructure 120 as illustrated in FIG. 38.

Subsequently, as illustrated in FIG. 39, another film of silicon nitride (SiN) being designed for application of compressive stress and having a thickness of approximately 80 nm is formed as the second stressing film 109 over the layered structure of FIG. 38. In addition, a film of $SiO_2$ or the like having a thickness of approximately 20 nm is formed as the third etching stopper film 110 on the second stressing film 109. The third etching stopper film 110 is used as a hard mask in the second etching step, which is explained later. Alternatively, it is possible to dispense with the formation of the third etching stopper film 110.

After the second stressing film 109 and the third etching stopper film 110 are formed, in the second etching step, the portions of the second stressing film 109 and the third etching stopper film 110 formed over the nMOS substructure 120 are removed by etching. After the second etching step, the second stressing film 109 and the third etching stopper film 110 remain over only the pMOS substructure 130 as illustrated in FIG. 40. In the structure illustrated in FIG. 40, the portion of the first stressing film 107 remaining over the nMOS substructure 120 and one of the trenches 102 which is located between the nMOS substructure 120 and the pMOS substructure 130, and the portion of the second stressing film 109 remaining over the pMOS substructure 130 and the one of the trenches 102 are not apart from each other and do not overlap with each other. That is, the above portion of the first stressing film 107 and the above portion of the second stressing film 109 abut each other at the position vertically above the boundary between the p-well 121 and the n-well 131.

In the above process, the second stressing film 109 for application of compressive stress is formed after the first stressing film 107 for application of tensile stress is formed. Alternatively, it is possible to form the first stressing film 107 for application of tensile stress after the second stressing film 109 for application of compressive stress is formed and the patterning and etching are performed.

After the structure illustrated in FIG. 40 is formed, a film of $SiO_2$ or phosphosilicate glass (PSG) having a thickness of approximately 370 nm is formed over the structure of FIG. 40, as illustrated in FIG. 41. Thereafter, a contact hole which extends through the interlayer insulation film 111 to the depth of the silicide region 105 is formed, and then the contact hole is filled with a predetermined material for electrode, so that a contact electrode is formed.

FIGS. 42 and 43 are schematic cross-sectional and plan views of a first example of the essential portion of the CMOS structure. In FIGS. 42 and 43, the contact-hole formation region (in which the contact hole is formed) is indicated by dashed lines. In FIG. 43, the interlayer insulation film 111 and the first and second etching stopper films 106 and 108 are not shown.

According to the normal design, as illustrated in FIGS. 42 and 43, the contact-hole formation region 112 (in which the contact hole extending to the silicide region 105 is formed) is arranged in such a manner that the center of the region 112 is located approximately vertically above the boundary between the first stressing film 107 and second stressing film 109, i.e., the boundary between the p-well 121 and the n-well 131. In FIGS. 42 and 43, the boundary between the p-well 121 and the n-well 131 is indicated by the dashed line Q.

However, in the case where the contact hole is formed in the contact-hole formation region 112 as above, according to the aforementioned process for forming the stressing films, the thickness of the second stressing film 109 at the bottom of the contact hole is approximately twice the thickness of the first stressing film 107 as illustrated in FIG. 42. Therefore, if the near-bottom portion of the contact-hole formation region 112 is simply etched, according to the properties of the first and second stressing films 107 and 109, overetching for exposing the silicide region 105 becomes insufficient in the thick portion of the second stressing film 109 even when the overetching for exposing the silicide region 105 is sufficient in the first stressing film 107. In such a case, it is possible to cause overetching sufficient to remove the thick portion of the second stressing film 109. However, when etching which causes overetching sufficient to remove the thick portion of the second stressing film 109 is performed, the portion of the silicide region 105 located under the bottom of the contact-hole formation region 112 (in particular, the portion of the silicide region 105 located under the first stressing film 107) is prone to etching damage, which can cause problems such as increase in the resistance.

Although the first and second stressing films 107 and 109 abut each other in the example illustrated in FIGS. 42 and 43, in practice, the first and second stressing films 107 and 109 can partially overlap, or a gap may be produced between the first and second stressing films 107 and 109.

FIG. 44 and FIG. 45 schematic cross-sectional views of second and third examples of the essential portion of the CMOS structure in each of which a contact-hole formation region is indicated. In FIGS. 44 and 45, the same elements as FIGS. 42 and 43 bear the same reference numbers as FIGS. 42 and 43.

In the second example illustrated in FIG. 44, a portion of the second stressing film 109 overlaps the first stressing film 107 (which is formed before the second stressing film 109) at the bottom of the contact-hole formation region 112. In the third example illustrated in FIG. 45, a gap is produced between the first and second stressing films 107 and 109 at the bottom of the contact-hole formation region 112. The above overlapping or the gap is caused by misalignment in patterning for formation of the first and second stressing films 107 and 109. In practice, one or a mixture of the situations illustrated in FIGS. 42, 44, and 45 can occur at the bottom of the contact-hole formation region 112.

For example, consider a case where the contact-hole formation region 112 containing the arrangement illustrated in FIG. 44 or 45 is etched under an etching condition designed for the arrangement illustrated in FIG. 42 in which the edges of the stressing films 107 and 109. The etching under the above etching condition cannot realize sufficient overetching in the region in which the first and second stressing films 107 and 109 overlap, so that the opening formed by the above etching becomes insufficient for being the contact hole. In particular, in the case where a portion of the second etching stopper film 108 is formed over the first stressing film 107, the opening formed by the above etching is more likely to be insufficient. On the other hand, in the case where a gap is produced between the first and second stressing films 107 and 109 at the bottom of the contact-hole formation region 112, the silicide region 105 exposed in the gap or the gate electrode 104 underlying the silicide region 105 can be damaged by excessive overetching.

As explained above, in the case where predetermined stressing films are dividedly formed over the nMOS substructure and pMOS substructure constituting a CMOS structure, and a contact hole is formed through the boundary between the stressing films, etching damage can occur in conductive regions such as a silicide region or a gate electrode located under the contact hole, or the contact hole (which extends to the conductive regions) can be imperfectly formed, so that the resistance increases or electric connection failure can occur.

SUMMARY OF THE INVENTION

The present invention is made in view of the above problems.

The first object of the present invention is to provide a semiconductor device being able to effectively suppress increase in resistance and occurrence of electric connection failure which can occur in a contact structure formed through a layer constituted by dividedly formed films.

The second object of the present invention is to provide a process for producing the above semiconductor device.

In order to accomplish the above first object, a semiconductor device having a contact structure is provided. The semiconductor device comprises: a conductive region; a first film and a second film which are formed over the conductive region to realize a layer; and a contact electrode which extends through the layer to the conductive region, and is formed so as to replace a portion of the layer with a portion of the contact electrode, where the portion of the layer is constituted by only the first film, only the second film, or both of a portion of the first film and a portion of the second film, and the portion of the first film occupies a major part of the portion of the layer.

In addition, in order to accomplish the aforementioned second object, a process for producing a semiconductor device having a contact structure is provided. The process comprises the steps of: (a) forming a conductive region; (b) forming a first film and a second film over the conductive region to realize a layer; (c) forming a contact hole extending to the conductive region through the layer so as to remove a portion of the layer, where the portion of the layer is constituted by only the first film, only the second film, or both of a portion of the first film and a portion of the second film, and the portion of the first film occupies a major part of the portion of the layer; and (d) forming a contact electrode in the contact hole.

Further, in order to accomplish the aforementioned second object, another process for producing a semiconductor device having a contact structure is also provided. This process comprises the steps of: (a) forming a conductive region over a semiconductor structure; (b) forming a first film over the conductive region to form a layer; (c) removing a first part of the first film so as to leave a second part of the first film; (d) forming a second film over the semiconductor structure after the steps (a) to (c) are performed; (e) depositing resist over a first part of the second film so that a second part of the second film is exposed; (f) performing isotropic etching by using the resist as a mask so as to remove the second part of the second film; (g) forming a contact hole which extends to the conductive region; and (h) forming a contact electrode in the contact hole.

The above and other objects, features and advantages of the present invention will become apparent from the following description when taken in conjunction with the accompanying drawings which illustrate preferred embodiment of the present invention by way of example.

BRIEF DESCRIPTION OF THE DRAWINGS

FIGS. 11 to 13 are schematic cross-sectional views of the basic structures of semiconductor devices according to a third embodiment of the present invention in which a portion of the etching stopper films is dispensed with.

FIGS. 18A to 18F are schematic cross-sectional views of examples of a first type of arrangement of stressing films and a contact-hole formation region in the stage before formation of a contact hole, where the stressing films are dividedly formed by use of anisotropic etching without use of isotropic etching.

FIGS. 25A to 25F are schematic cross-sectional views of examples of an eighth type of arrangement of stressing films and a contact-hole formation region in the stage before formation of a contact hole, where the stressing films are dividedly formed by use of anisotropic etching without use of isotropic etching.

DESCRIPTION OF THE PREFERRED EMBODIMENTS

Preferred embodiments of the present invention will be explained below with reference to the accompanying drawings, wherein like reference numbers refer to like elements throughout. First, an outline of the present invention which is realized in the embodiment is indicated, and thereafter details of the embodiment are explained.

First Embodiment

Figure 1:
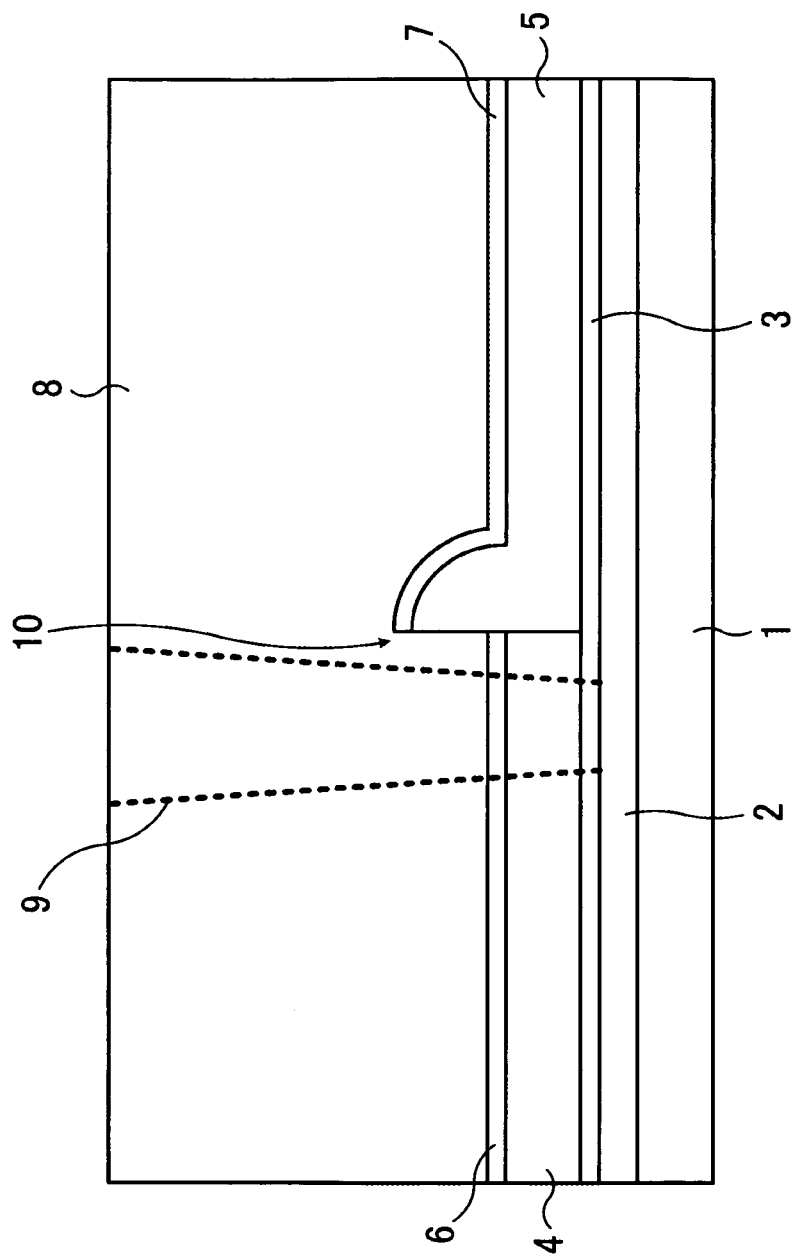
FIG. 1 is a schematic cross-sectional view of the basic structure of a semiconductor device according to a first embodiment of the present invention.

The semiconductor device according to the first embodiment of the present invention is explained below by taking a basic structure as an example. FIG. 1 is a schematic cross-sectional view of the basic structure of the semiconductor device according to the first embodiment. As illustrated in FIG. 1, the basic structure contains a contact structure in which a conductive region (made of a conductive material) is formed over different types of substructures (not shown), different films are dividedly formed in an upper layer located over the different types of substructures, and a contact electrode extending to the conductive region is formed.

For example, in the case of the CMOS inverter circuit in which an nMOS transistor and a pMOS transistor shares a gate electrode, and stressing films having different properties are dividedly formed over the nMOS transistor and the pMOS transistor in order to improve the device performance, a contact hole electrically connected to the gate electrode is formed after the stressing films are formed. In the structure illustrated in FIG. 1, a silicide region 2 is formed over a gate electrode 1, a first etching stopper film 3 is formed over the silicide region 2, a first stressing film 4 and a second stressing film 5 having different properties are dividedly formed over the first etching stopper film 3, a second etching stopper film 6 and a third etching stopper film 7 are respectively formed over the first stressing film 4 and second stressing film 5, and an interlayer insulation film 8 is formed over the second etching stopper film 6 and third etching stopper film 7.

For example, the gate electrode 1 is formed of polysilicon, the silicide region 2 is formed of Co silicide, Ni silicide, Ti silicide, or the like, the first etching stopper film 3, the second etching stopper film 6, and the third etching stopper film 7 are formed of TEOS (tetraethylorthosilicate)-based $SiO_2$ or the like, and the interlayer insulation film 8 is formed of $SiO_2$, PSG (phosphosilicate), or the like.

The first and second stressing films 4 and 5 are, for example, SiN films having different properties, one is formed over an nMOS substructure (e.g., an nMOS transistor), and the other is formed over a pMOS substructure (e.g., a pMOS transistor). The stressing film formed over the nMOS substructure has a property of applying tensile stress to a channel region in the nMOS substructure, and the stressing film formed over the pMOS substructure has a property of applying compressive stress to a channel region in the pMOS substructure. Since the first stressing film 4 and the second stressing film 5 are dividedly formed as above, it is possible to increase the carrier mobility in each of the nMOS substructure and the pMOS substructure.

In the region (division region) 10 in which the boundary between the first and second stressing films 4 and 5 exists, the second stressing film 5 is thicker than the first stressing film 4. This is because the second stressing film 5 is formed after the first stressing film 4. The first stressing film 4 and the second stressing film 5 can be formed over different types of substructures, for example, by the following process.

In the first step of the process, the first etching stopper film 3, the first stressing film 4, and the second etching stopper film 6 are formed over the entire surface of the silicide region 2. In the second step, a portion of the first stressing film 4 located in the area in which the second stressing film 5 is to be formed and a portion of the second etching stopper film 6 located on the portion of the first stressing film 4 are removed. In the third step, the second stressing film 5 and the third etching stopper film 7 are formed over the layered structure formed in the second step. In the final step, a portion of the second stressing film 5 located on the remaining portion of the first stressing film 4 and a portion of the third etching stopper film 7 located on the portion of the second stressing film 5 are removed. When the first stressing film 4 and the second stressing film 5 are formed in the above process, the second stressing film 5 becomes thicker than the first stressing film 4 in the division region 10 in which the first stressing film 4 and the second stressing film 5 (formed after the first stressing film 4) abut each other.

According to the first embodiment, in order to form a contact hole extending through the interlayer insulation film 8 to the silicide region 2, a region 9 in which the contact hole is to be formed (which is hereinafter referred to as the contact-hole formation region 9) is determined so that the contact hole is formed through the first stressing film 4 as indicated by the dashed lines in FIG. 1. In other words, the contact-hole formation region 9 is determined so that the contact-hole formation region 9 includes only the first stressing film 4 as a stressing film in the vicinity of the bottom of the contact-hole formation region 9. As explained later, the division region 10 and the contact-hole formation region 9 are determined in consideration of displacement of each of the first and second stressing films 4 and 5 which can occur when the first and second stressing films 4 and 5 are formed.

The arrangement of the division region 10 and the contact-hole formation region 9 as illustrated in FIG. 1 can be realized by changing the arrangement of only the contact-hole formation region 9, changing the arrangement of only the division region 10, or changing the arrangement of both of the contact-hole formation region 9 and the division region 10, from a reference layout in which no displacement of the first and second stressing films 4 and 5 is assumed. In practice, it is possible to choose the most advantageous manner of changing the arrangement of the division region 10 and the contact-hole formation region 9 in consideration of the overall arrangement of the circuit to be formed.

In the case where the division region 10 and the contact-hole formation region 9 are arranged as illustrated in FIG. 1, the contact hole can be formed by simply etching the interlayer insulation film 8, the second etching stopper film 6, the first stressing film 4, and the first etching stopper film 3 in this order. Therefore, it is possible to effectively suppress the etching damage to the silicide region 2 and the occurrence of insufficient overetching, compared with the conventional structure in which the contact hole is formed by etching the boundary region between the first and second stressing films 4 and 5. Thus, the structure illustrated in FIG. 1 becomes a low-resistance contact structure.

In the structure explained above, the edges of the first and second stressing films 4 and 5 are aligned (abut each other) as illustrated in FIG. 1. However, as mentioned before, according to the first embodiment, the division region 10 and the contact-hole formation region 9 are arranged so that the contact-hole formation region 9 includes only one of the first and second stressing films 4 and 5 as a stressing film in the vicinity of the bottom of the contact-hole formation region 9 even when the edges of the first and second stressing films 4 and 5 are not aligned (i.e., when the first and second stressing films 4 and 5 overlap or are apart).

Figure 2:
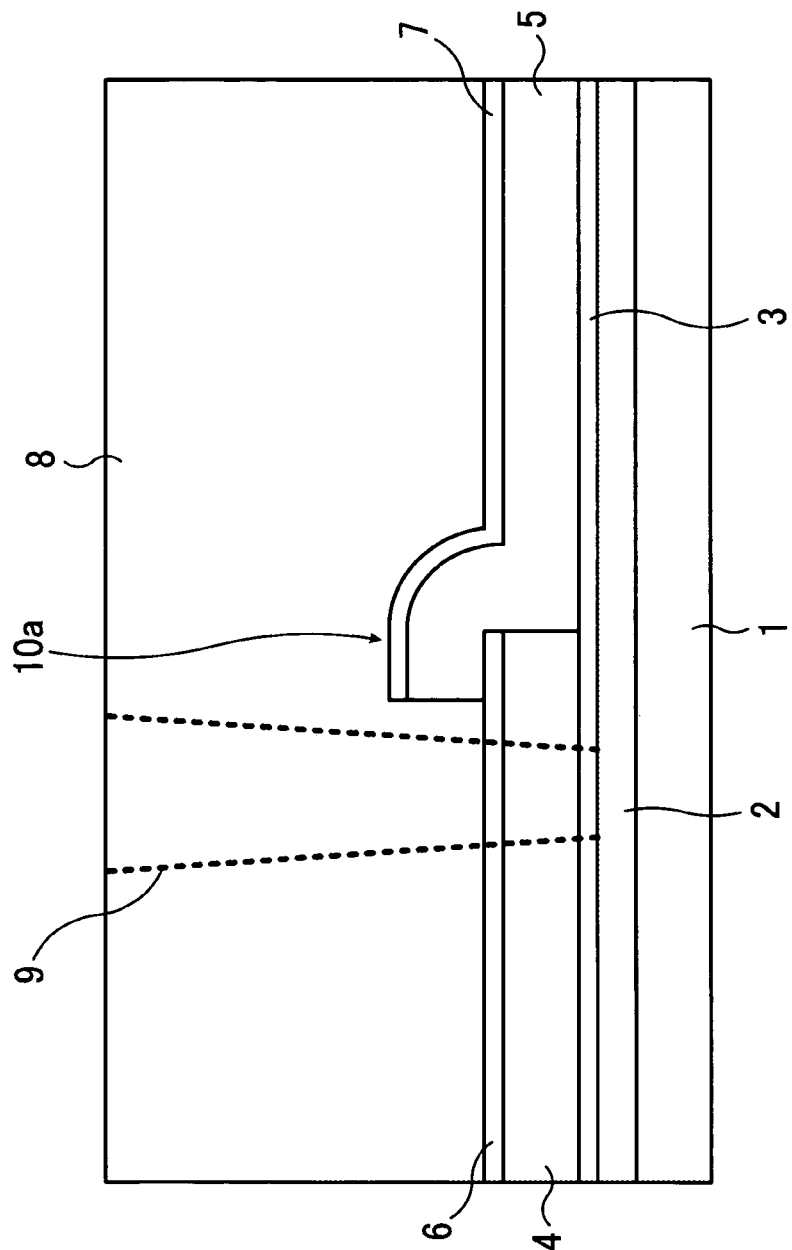
FIG. 2 is a schematic cross-sectional view of a semiconductor device according to the first embodiment of the present invention in which stressing films overlap.
Figure 3:
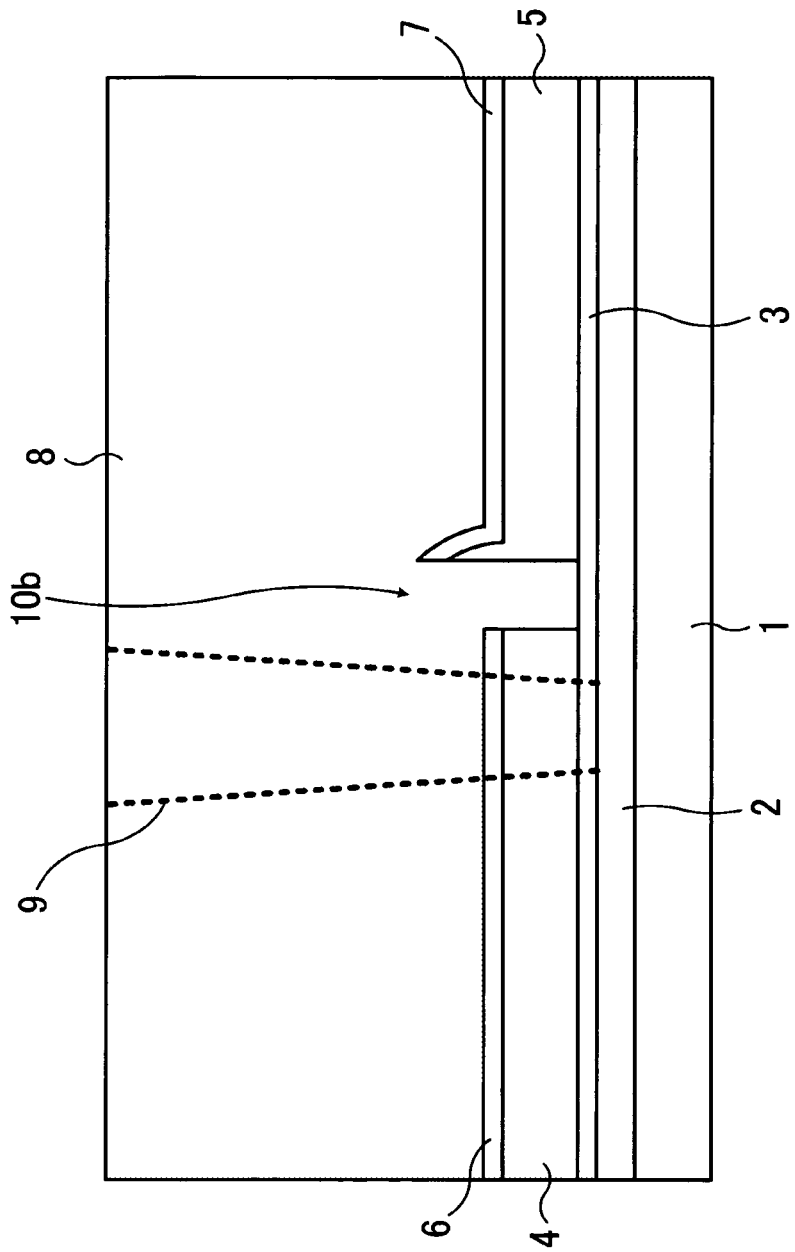
FIG. 3 is a schematic cross-sectional view of a semiconductor device according to the first embodiment of the present invention in which stressing films are apart from each other.

FIG. 2 is a schematic cross-sectional view of a semiconductor device according to the first embodiment in which the near-edge portions of the first and second stressing films overlap, and FIG. 3 is a schematic cross-sectional view of another semiconductor device according to the first embodiment in which a gap is produced between the edges of the first and second stressing films.

When the first and second stressing films 4 and 5 are formed in the aforementioned process, for example, a portion of the second stressing film 5 can overlie on a portion of the first stressing film 4 as illustrated in FIG. 2. Therefore, the layout of the division region 10a and the contact-hole formation region 9 is determined in consideration of possible occurrence of such misalignment between the edges of the first and second stressing films 4 and 5 so that the contact-hole formation region 9 includes only the first stressing film 4 as a stressing film as indicated by the dashed lines in FIG. 1.

In addition, when the first and second stressing films 4 and 5 are formed in the aforementioned process, for example, a gap is produced between the edges of the second stressing films 5 and 4 as illustrated in FIG. 3. Therefore, the arrangement of the division region 10b and the contact-hole formation region 9 is determined in consideration of such misalignment between the edges of the first and second stressing films 4 and 5 so that the contact hole is formed through the first stressing film 4 as indicated by dashed lines in FIG. 1.

Hereinbelow, details of CMOS structures in which a division region and a contact-hole formation region are arranged as described above are explained.

Figure 4:
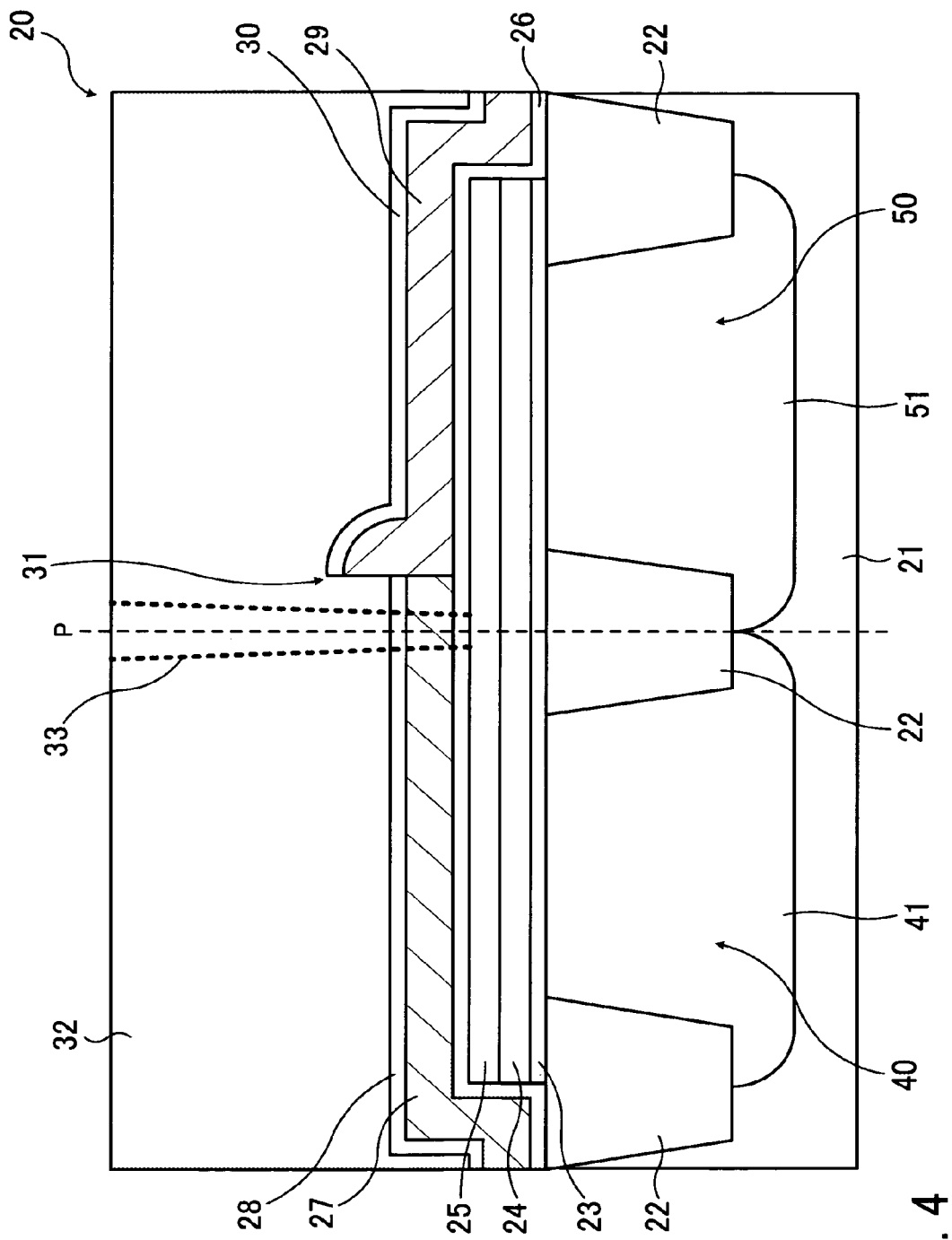
FIGS. 4 and 5 are schematic cross-sectional and plan views of an essential portion of a CMOS structure according to the first embodiment of the present invention.
Figure 5:
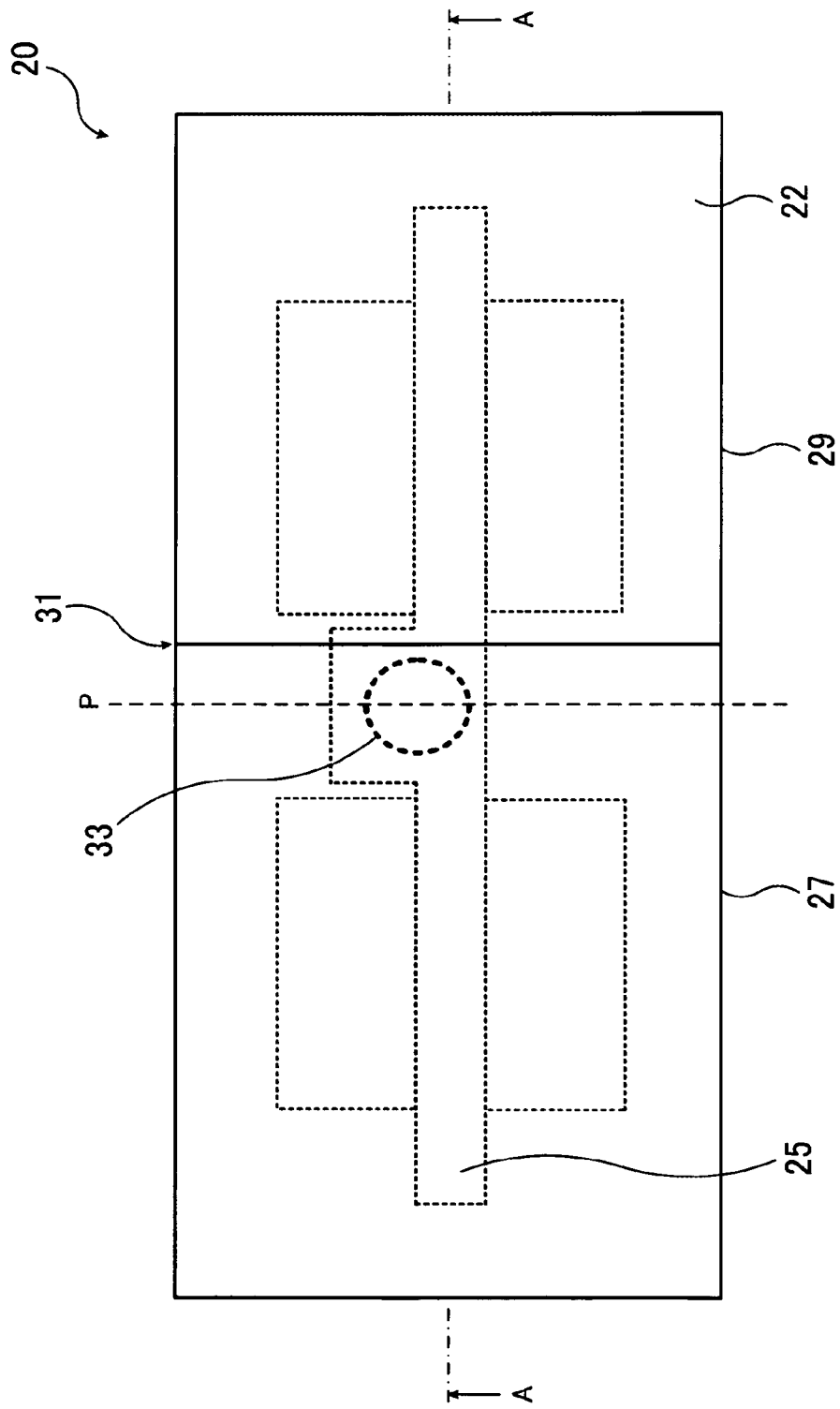

FIGS. 4 and 5 are schematic cross-sectional and plan views of an essential portion of a CMOS structure according to the first embodiment. FIG. 4 shows the cross section A-A, which is indicated in FIG. 5. In FIG. 5, the interlayer insulation film and the etching stopper layers are not shown for simplification.

The CMOS structure 20 illustrated in FIGS. 4 and 5 constitutes an inverter circuit, and an nMOS substructure 40 and a pMOS substructure 50 are formed on a Si substrate 21. The nMOS substructure 40 and the pMOS substructure 50 are isolated from each other by shallow trench isolation (STI) 22. In the Si substrate 21, a p-well 41 is formed in the vicinity of the nMOS region 40, and an n-well 51 is formed in the vicinity of the pMOS region 50. The boundary between the p-well 41 and the n-well 51 is located approximately in the middle between the nMOS substructure 40 and the pMOS substructure 50 as indicated by the dashed line P in FIGS. 4 and 5.

A gate electrode 24 common to the nMOS substructure 40 and the pMOS substructure 50 is arranged over the nMOS substructure 40 and the pMOS substructure 50 through a gate insulation film 23, and side walls (not shown) are formed on the sides of the gate electrode 24. In addition, source and drain regions (not shown) are formed in the Si substrate 21 on both sides of the gate electrode 24. Further, a region 25 of a silicide of cobalt (Co), nickel (Ni), titanium (Ti), or the like is formed over the gate electrode 24. Although not shown, silicide regions are also formed over the source and drain regions as well as the gate electrode 24.

Further, a first stressing film 27 for applying tensile stress to the nMOS substructure 40 is formed over the nMOS substructure 40 through a first etching stopper film 26, and a second etching stopper film 28 is formed over the first stressing film 27. In addition, a second stressing film 29 for applying compressive stress to the pMOS substructure 50 is formed over the pMOS substructure 50 through the first etching stopper film 26, and a third etching stopper film 30 is formed over the second stressing film 29.

In the structure illustrated in FIG. 4, the second stressing film 29 is thicker than the first stressing film 27 In the region (division region) 31 in which the boundary between the first and second stressing films 27 and 29 exists, and the division region 31 is arranged on the pMOS-substructure side of the middle between the nMOS substructure 40 and the pMOS substructure 50.

Furthermore, an interlayer insulation film 32 is formed over the above structure, and a contact hole extending through the interlayer insulation film 32 to the silicide region 25 is formed. In this example, the region 33 in which the contact hole is to be formed (which is hereinafter referred to as the contact-hole formation region 33) is located approximately in the middle between the nMOS substructure 40 and the pMOS substructure 50, i.e., the contact-hole formation region 33 is set so that a diameter of the contact-hole formation region 33 coincides with the aforementioned boundary between the nMOS substructure 40 and the pMOS substructure 50 as indicated by the dashed line P.

A process for producing the above CMOS structure 20 is explained below.

The first etching stopper film 26, the first stressing film 27, and the second etching stopper film 28 are formed over the structure in which the nMOS substructure 40 and the pMOS substructure 50 including the gate insulation film 23, the gate electrode 24, and the silicide region 25 are formed on the Si substrate 21.

Then, a portion of the first stressing film 27 located in the area in which the second stressing film 29 is to be formed and a portion of the second etching stopper film 28 located on the portion of the first stressing film 27 are removed by patterning. After the portion of the first stressing film 27 and the portion of the second etching stopper film 28 are removed, the remaining portion of the second etching stopper film 28 is used as a hard mask. In addition, the removal of the portion of the second etching stopper film 28 and the portion of the first stressing film 27 is performed with consideration of the total overlay (TOL) precision of the patterning system so that the region (division region) 31 in which the boundary between the first and second stressing films 27 and 29 exists is displaced toward the pMOS substructure 50 from the middle between the nMOS substructure 40 and the pMOS substructure 50 by the greatest amount practicable.

Subsequently, the second stressing film 29 and the third etching stopper film 30 are formed over the layered structure formed as above, and finally a portion of the second stressing film 29 located on the remaining portion of the first stressing film 27 and a portion of the third etching stopper film 30 located on the portion of the second stressing film 29 are removed by patterning. After the portion of the second stressing film 29 and the portion of the third etching stopper film 30 are removed, the remaining portion of the third etching stopper film 30 is used as a hard mask.

The first and second stressing films 27 and 29 are realized by SiN films having identical thicknesses of approximately 80 nm and different properties. The first, second, and third etching stopper films 26, 28, and 30 are formed of TEOS-based $SiO_2$. The first etching stopper film 26 has a thickness of approximately 10 nm, and the second and third etching stopper films 28 and 30 have thicknesses of approximately 20 nm.

Since the first and second stressing films 27 and 29 are formed in the above order, the division region 31 (in which the boundary between the first and second stressing films 27 and 29 exists) can be arranged on the pMOS-substructure side of the middle between the nMOS substructure 40 and the pMOS substructure 50, and the second stressing film 29 (which is formed after the first stressing film 27) is thicker than the first stressing film 27 in the division region 31.

Figure 42:
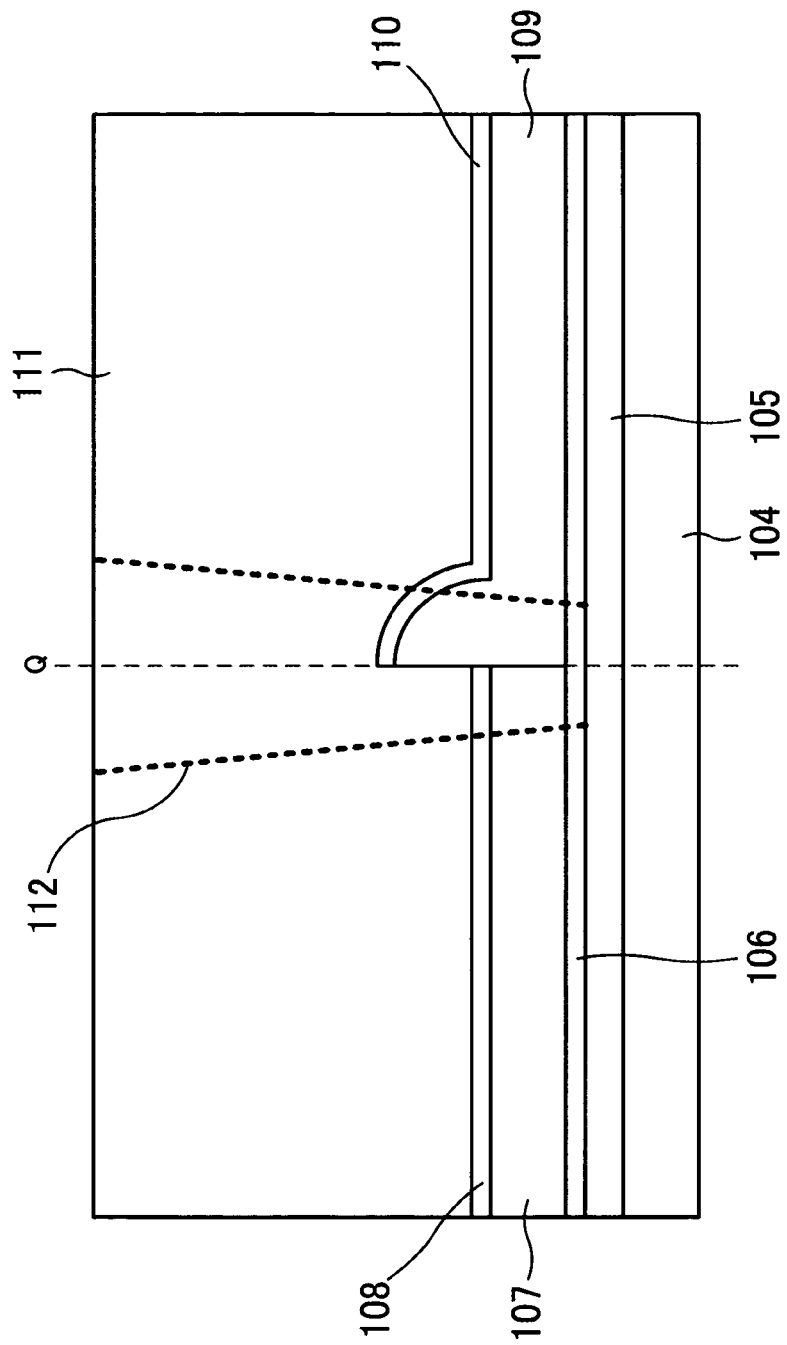
FIGS. 42 and 43 are schematic cross-sectional and plan views of a first example of the essential portion of the CMOS structure including a contact-hole formation region.
Figure 43:
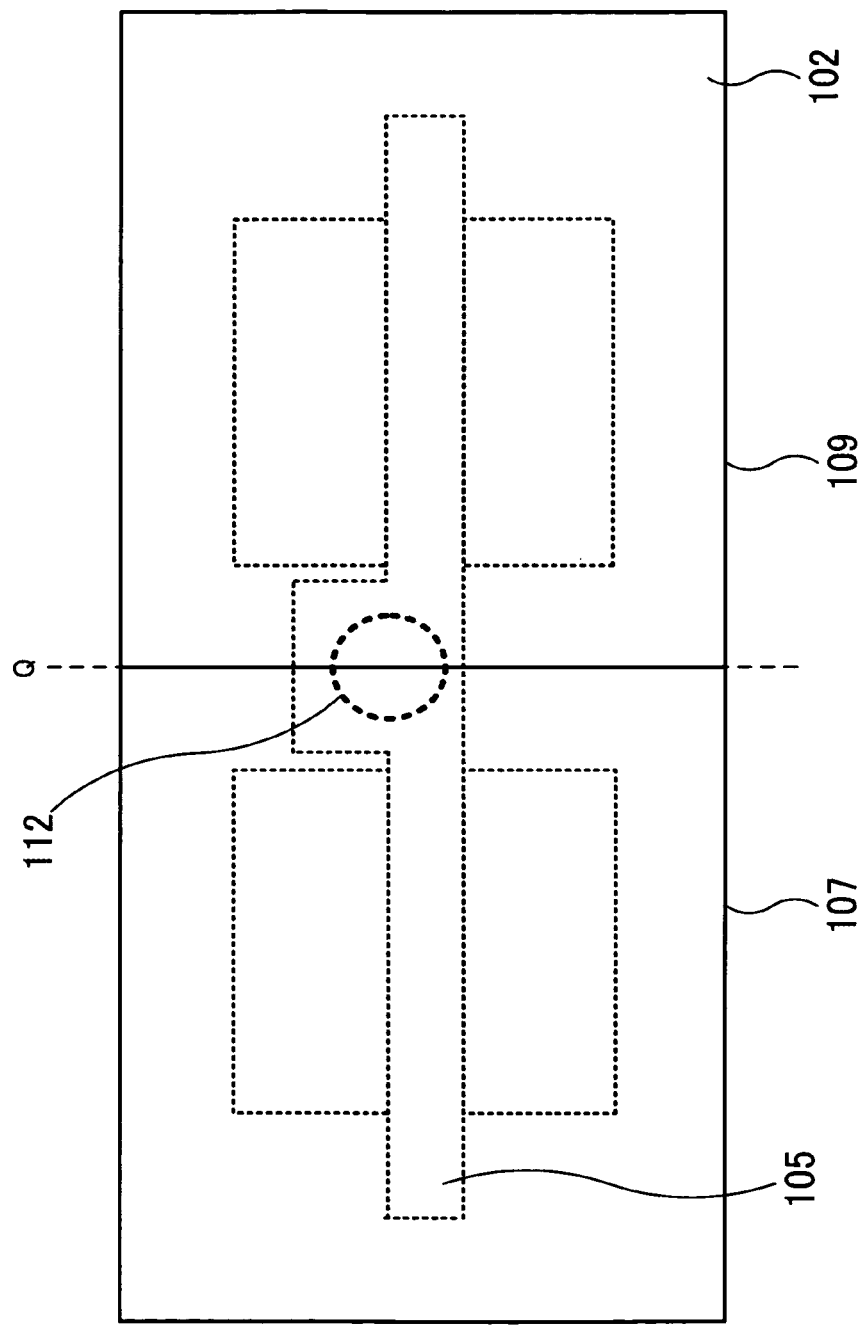
Figure 44:
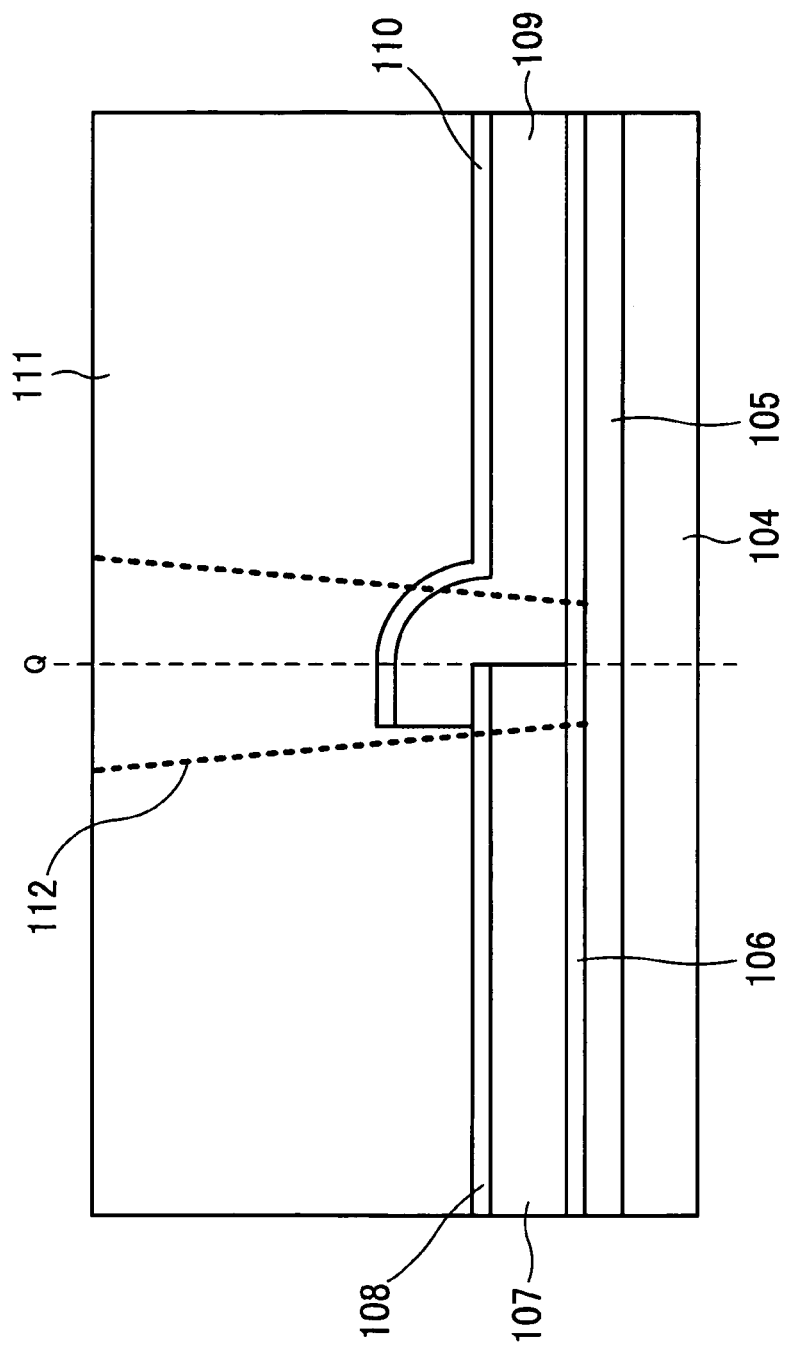
FIG. 44 is a schematic cross-sectional view of a second example of the essential portion of the CMOS structure including a contact-hole formation region.
Figure 45:
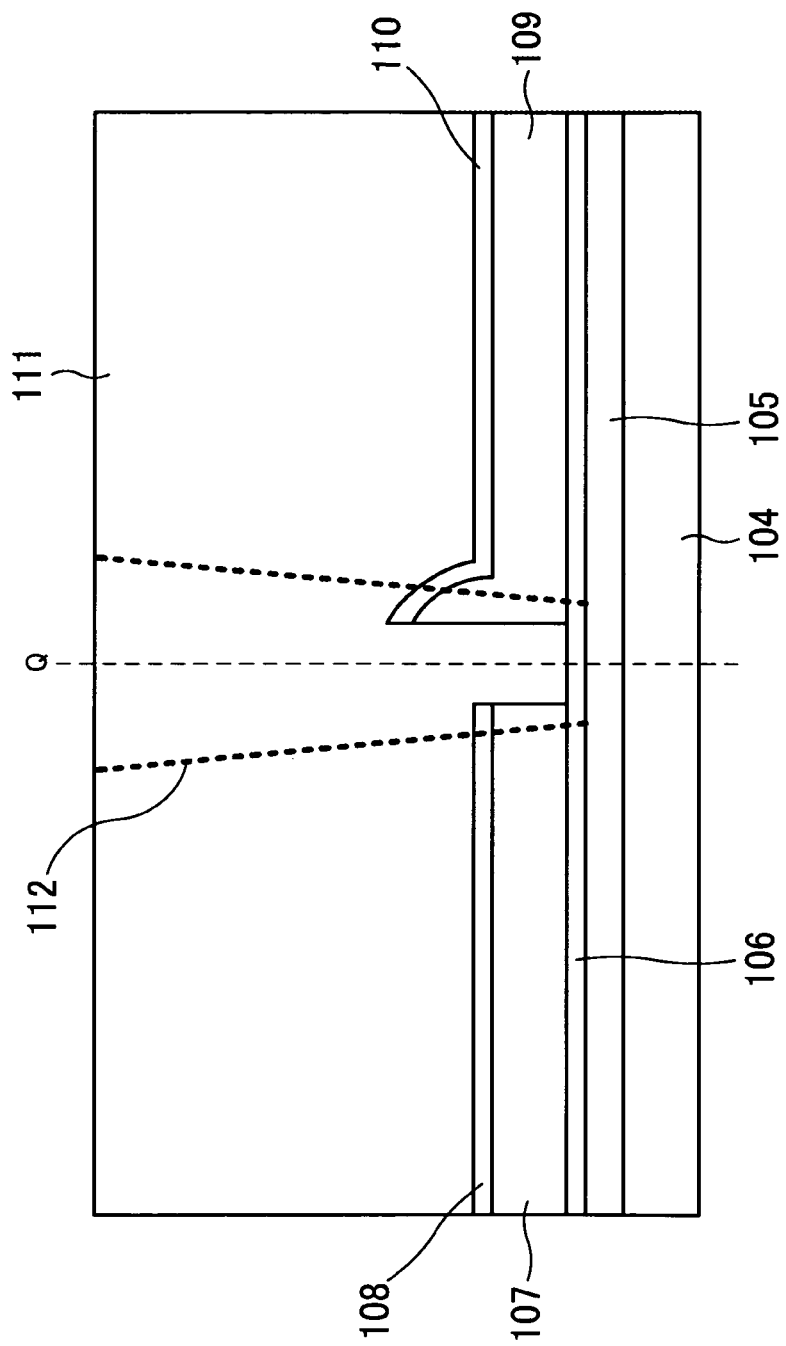
FIG. 45 is a schematic cross-sectional view of a third example of the essential portion of the CMOS structure including a contact-hole formation region.

Thereafter, for example, a PSG film having a thickness of approximately 370 nm is formed as the interlayer insulation film 32, and then etching is performed so as to form the contact hole extending to the portion of the silicide region 25 located vertically above the middle between the nMOS substructure 40 and the pMOS substructure 50. Thus, the contact-hole formation region 33 (in which the contact hole is formed) and the division region 31 (in which the boundary between the first and second stressing films 27 and 29 exists) are arranged at different positions as illustrated in FIGS. 4 and 5, while the contact hole is arranged through the division region in the conventional CMOS structure as illustrated in FIGS. 42 and 43.

The etching for forming the contact hole is performed on the interlayer insulation film 32, the second etching stopper film 28, the first stressing film 27, and the first etching stopper film 26, so that the contact-hole formation region 33 includes only the first stressing film 27 as a stressing film in the vicinity of the bottom of the contact-hole formation region 33. Since the contact-hole formation region 33 (in which the contact hole is formed) and the division region 31 are arranged as explained before, it is possible to suppress the etching damage to the silicide region 25 and the insufficient overetching. Finally, the conductive electrode is formed by filing the contact hole formed as explained above with a predetermined conductive material. Thus, it is possible to realize a semiconductor device containing the CMOS structure 20 and exhibiting low contact resistance to the CMOS structure 20.

In the example explained above, the contact-hole formation region 33 includes only the first stressing film 27 as a stressing film in the vicinity of the bottom of the contact-hole formation region 33. However, even in the case where a portion of the second stressing film 29 is included in the contact-hole formation region 33, it is also possible to suppress the etching damage to the silicide region 25 and the insufficient overetching and realize a contact structure exhibiting low contact resistance when the area of the portion of the second stressing film 29 included in the contact-hole formation region 33 is small, for example, less than 50% of the cross-sectional area of the contact-hole formation region 33.

In addition, when the first and second stressing films 27 and 29 are dividedly formed, the margin secured in patterning can make the first and second stressing films 27 and 29 overlap or produce a gap between the edges of the first and second stressing films 27 and 29. Therefore, the position of the division region 31 is determined in consideration of such misalignment. That is, the position of the division region 31 is determined so that the area of the gap between the first and second stressing films 27 and 29 or the overlap of the first and second stressing films 27 and 29 included in the contact-hole formation region 33 is less than a predetermined amount.

Further, although the division region 31 is arranged on the pMOS-substructure side of the middle between the nMOS substructure 40 and the pMOS substructure 50 in the above example illustrated in FIGS. 4 and 5, alternatively, it is possible to arrange the contact-hole formation region 33 on the nMOS-substructure side of the middle between the nMOS substructure 40 and the pMOS substructure 50 while arranging the division region 31 in the middle between the nMOS substructure 40 and the pMOS substructure 50. Further alternatively, it is also possible to arrange the division region 31 on the pMOS-substructure side of the middle, and the contact-hole formation region 33 on the nMOS-substructure side of the middle. In practice, it is possible to choose the most advantageous arrangement of the division region 31 and the contact-hole formation region 33 in consideration of the overall arrangement of the circuit containing the CMOS structure 20 which is to be formed.

Second Embodiment

Figure 6:
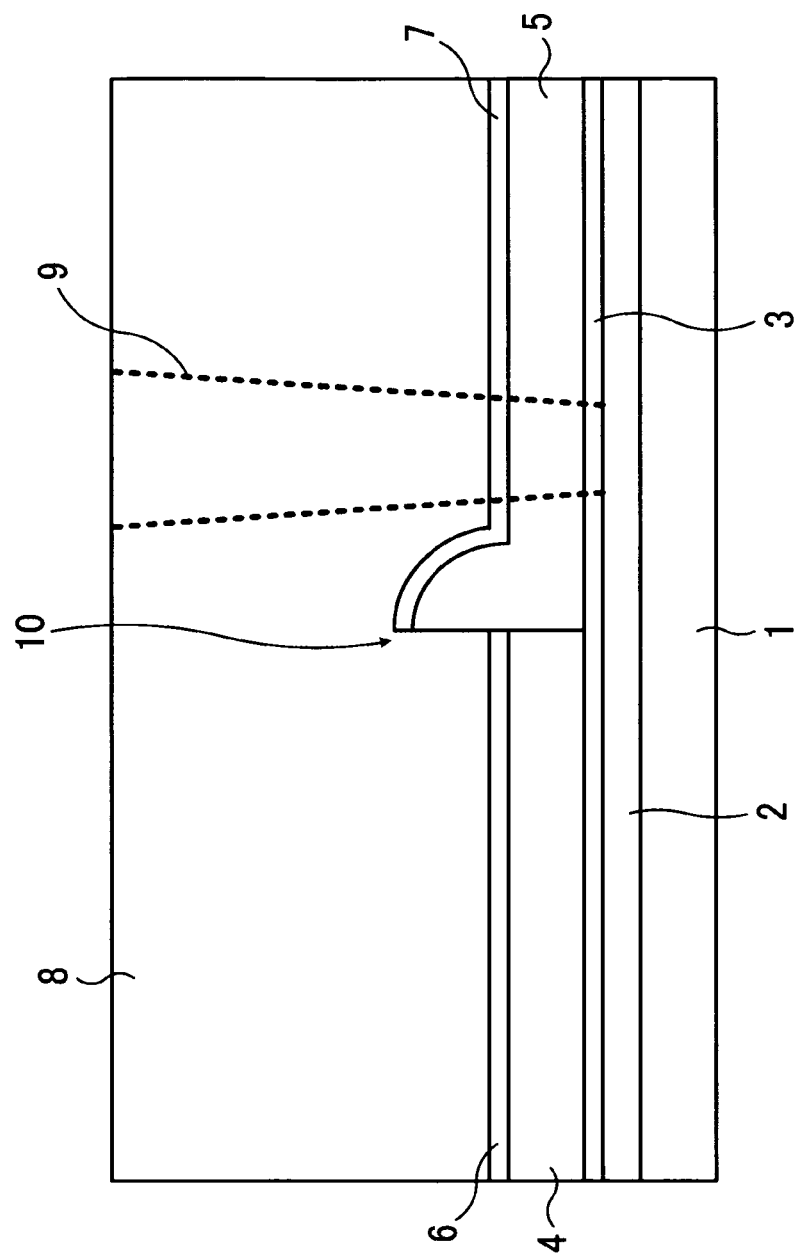
FIG. 6 is a schematic cross-sectional view of the basic structure of a semiconductor device according to a second embodiment of the present invention.

The semiconductor device according to the second embodiment of the present invention is explained below. FIG. 6 is a schematic cross-sectional view of the basic structure of a semiconductor device according to the second embodiment.

The semiconductor device according to the second embodiment illustrated in FIG. 6 is different from the first embodiment illustrated in FIG. 1 in that the contact-hole formation region 9 is arranged on the second-stressing-film side, where the second stressing film 5 is formed after the first stressing film 4 is formed. That is, the contact-hole formation region 9 and the division region 10 are arranged so that the contact-hole formation region 9 includes only the second stressing film 5 as a stressing film in the vicinity of the bottom of the contact-hole formation region 9 as indicated by the dashed lines in FIG. 6. For example, the contact-hole formation region 9 is arranged on the second-stressing-film side so as to avoid the thick portion of the second stressing film 5 in the boundary region between the first and second stressing films 4 and 5. In addition, when the layout of the contact-hole formation region 9 and the division region 10 is determined, it is necessary to consider misalignment caused by the patterning.

Figure 7:
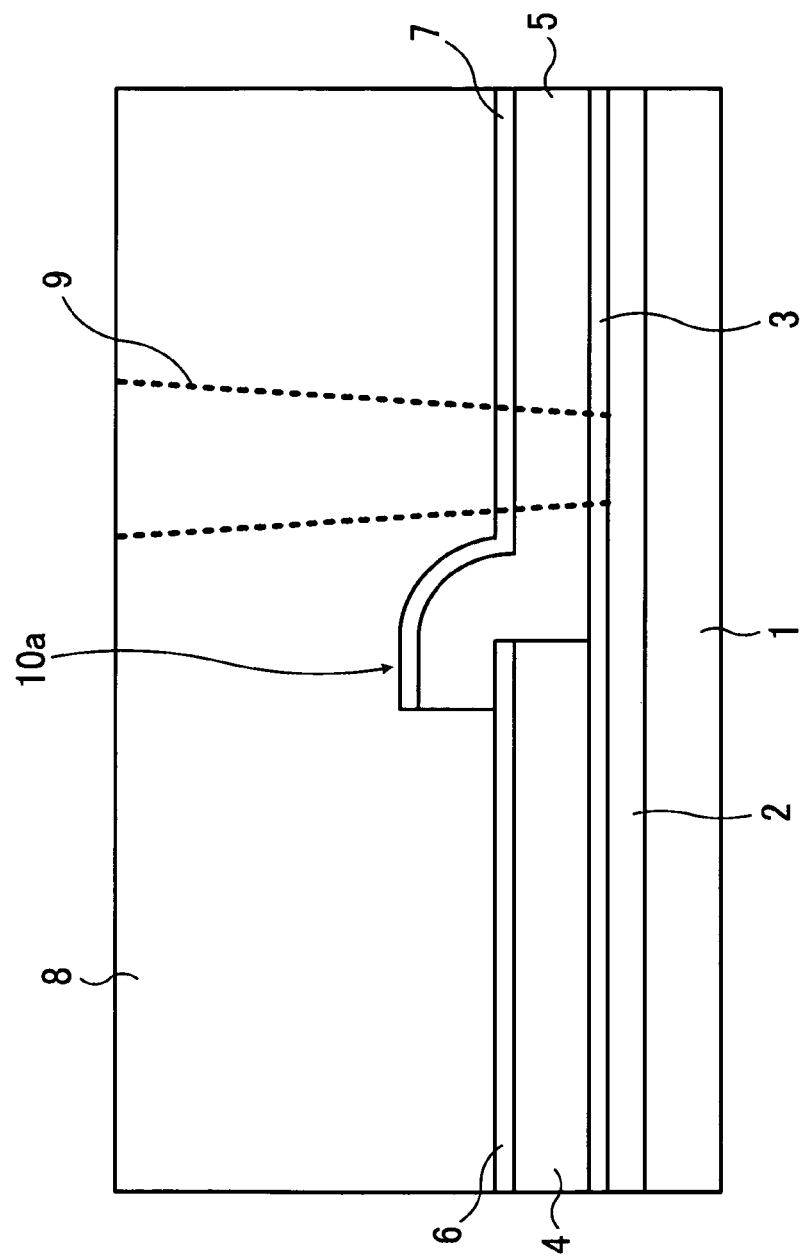
FIG. 7 is a schematic cross-sectional view of a semiconductor device according to the second embodiment of the present invention in which stressing films overlap.
Figure 8:
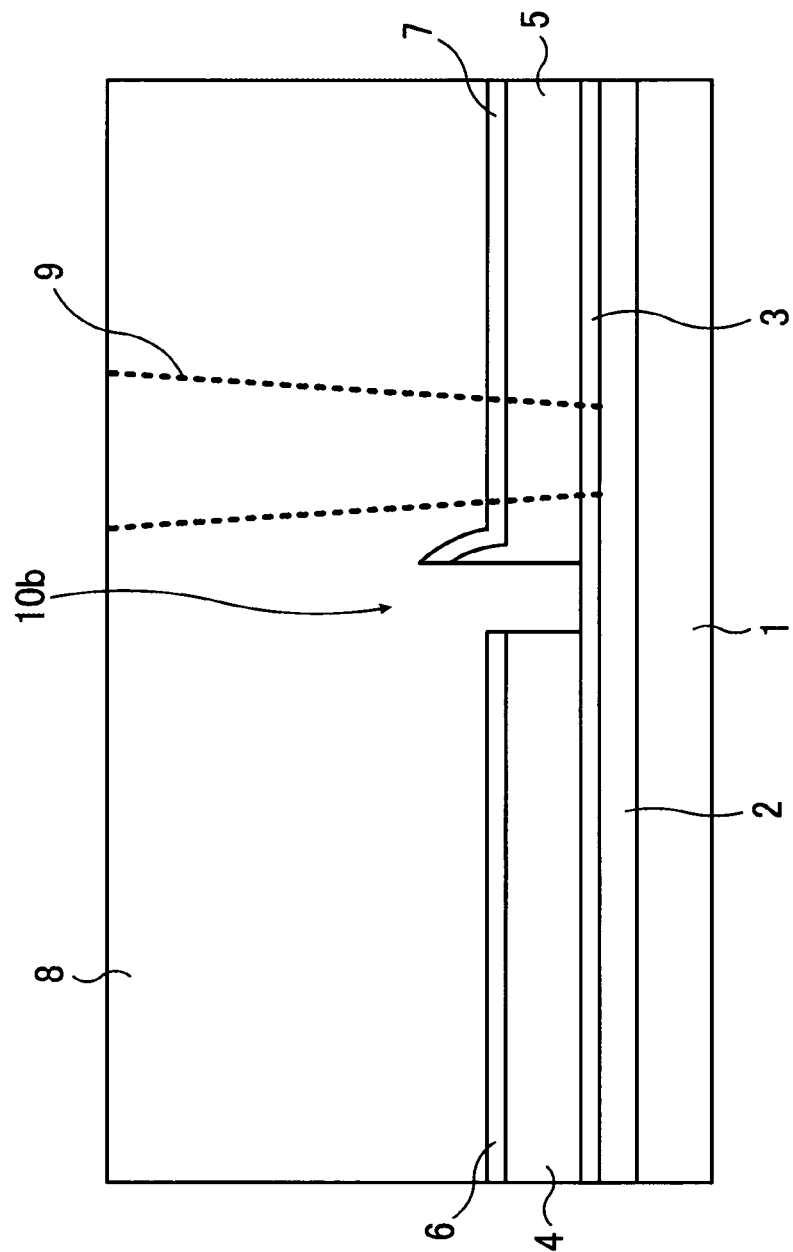
FIG. 8 is a schematic cross-sectional view of a semiconductor device according to the second embodiment of the present invention in which stressing films are apart from each other.

FIG. 7 is a schematic cross-sectional view of a semiconductor device according to the second embodiment in which the first and second stressing films overlap, and FIG. 8 is a schematic cross-sectional view of another semiconductor device according to the second embodiment in which a gap is produced between the first and second stressing films.

As illustrated in FIGS. 7 and 8, the contact-hole formation region 9 and the division region 10a or 10b are arranged so that the contact-hole formation region 9 includes only the second stressing film 5 as a stressing film in the vicinity of the bottom of the contact-hole formation region 9 even in the case where the near-edge portions of the first and second stressing films 4 and 5 overlap or a gap is produced between the edges of the first and second stressing films 4 and 5. In consideration of the above misalignment, the contact-hole formation region 9 is arranged on the second-stressing-film side, for example, at a distance from the edge of the first stressing film 4, where the distance corresponds to the sum of the width of the thick portion of the second stressing film 5 and the gap between the first and second stressing films 4 and 5 (or the width of the overlap of the first and second stressing films 4 and 5).

The arrangement as illustrated in FIGS. 6 to 8 of the division region 10a or 10b and the contact-hole formation region 9 can be realized by changing the arrangement of only the region 9, changing the arrangement of only the division region 10a or 10b, or changing the arrangement of both of the contact-hole formation region 9 and the division region 10a or 10b, from a reference layout in which no displacement of the first and second stressing films 4 and 5 is assumed. In practice, it is possible to choose the most advantageous manner of changing the arrangement in consideration of the overall arrangement of the circuit to be formed.

In the case where the division region 10a or 10b and the contact-hole formation region 9 are arranged according to the second embodiment as illustrated in FIGS. 6 to 8, the contact hole can be formed by simply etching the interlayer insulation film 8, the third etching stopper film 7, the second stressing film 5, and the first etching stopper film 3 in this order. Therefore, it is possible to effectively suppress the etching damage to the silicide region 2 and the occurrence of insufficient overetching. In addition, the arrangement according to the second embodiment as illustrated in FIGS. 6 to 8 is superior in the capability of performing etching for formation of the contact hole without etching the second etching stopper film 6 formed over the first stressing film 4, to the conventional structure in which the contact hole is formed by etching the boundary region between the first and second stressing films 4 and 5.

In the example explained above, the contact-hole formation region 9 includes only the second stressing film 5 as a stressing film in the vicinity of the bottom of the contact-hole formation region 9. However, even in the case where the contact-hole formation region 9 includes a portion of the first stressing film 4, it is also possible to suppress the etching damage to the silicide region 2 and the insufficient overetching and realize a contact structure exhibiting low contact resistance when the area of the portion of the first stressing film 4 included in the contact-hole formation region 9 is equal to or less than a predetermined amount.

Although the contact-hole formation region 9 is arranged so as to avoid the thick portion of the second stressing film 5 in the example explained above, the avoidance of the thick portion is not essential. If the increase in the thickness of the second stressing film 5 in the boundary region is an amount which is allowed in the etching process, the thick portion of the second stressing film 5 may be included in the contact-hole formation region 9.

Hereinbelow, a CMOS structure which is formed according to the second embodiment explained above are explained in detail.

Figure 9:
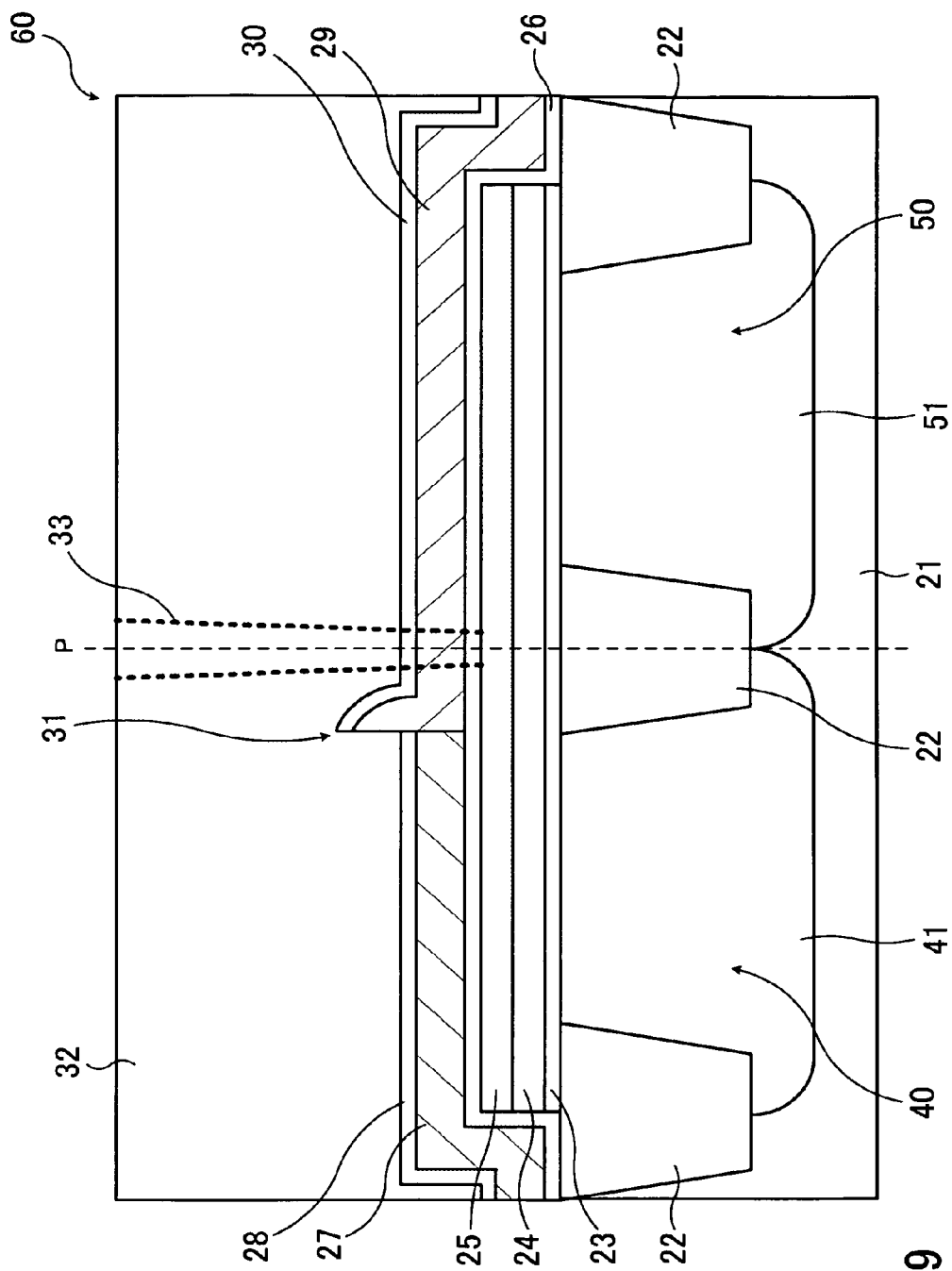
FIGS. 9 and 10 are schematic cross-sectional and plan views of an essential portion of a CMOS structure according to the second embodiment of the present invention.
Figure 10:
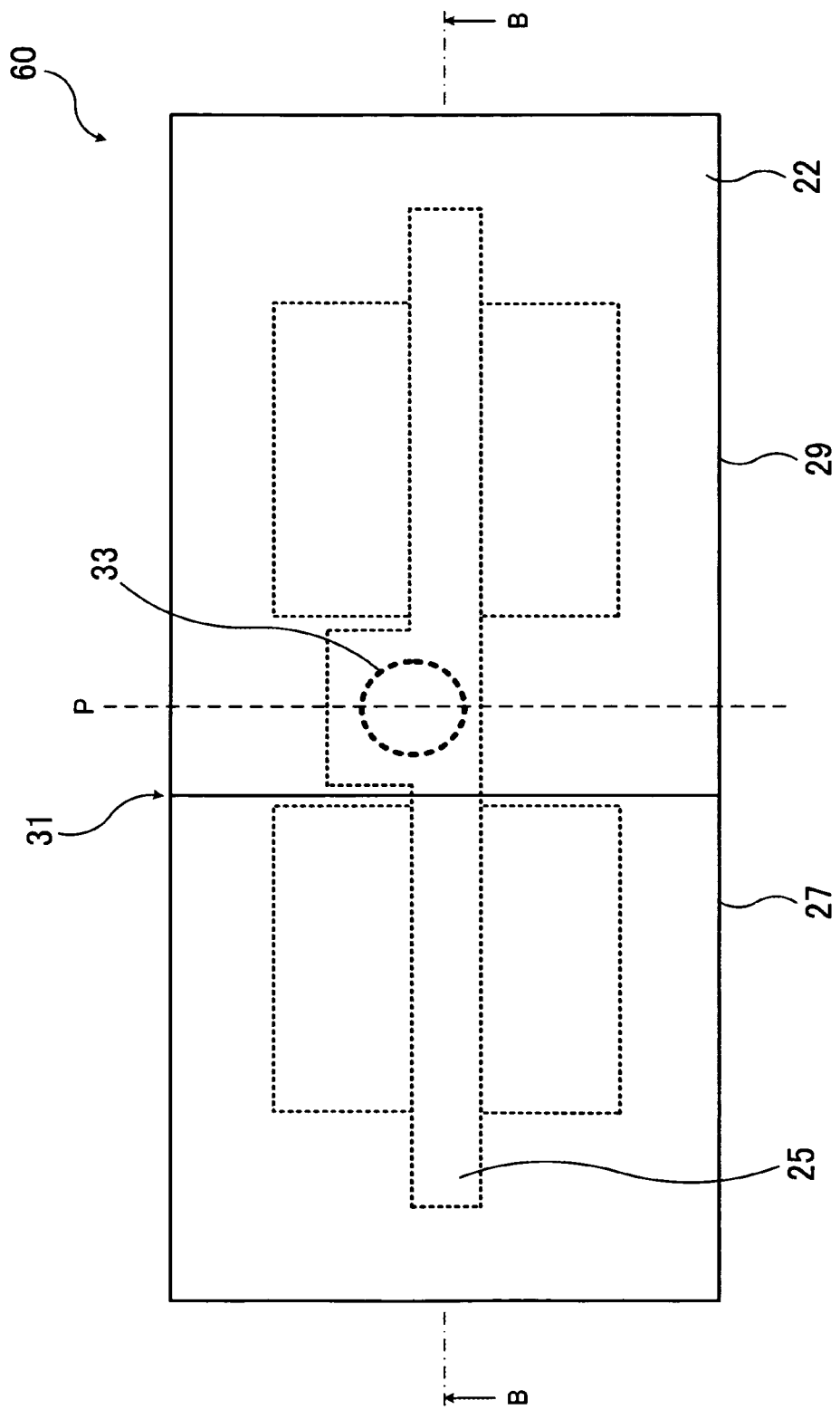

FIGS. 9 and 10 are schematic cross-sectional and plan views of an essential portion of a CMOS structure according to the second embodiment. FIG. 9 shows the cross section B-B, which is indicated in FIG. 10. In FIG. 10, the interlayer insulation film and the etching stopper layers are not shown for simplification.

The CMOS structure 60 illustrated in FIGS. 9 and 10 is different from the CMOS structure 20 according to the first embodiment (as illustrated in FIGS. 9 and 10) only in that the division region 31 between the first and second stressing films 27 and 29 is arranged on the nMOS-substructure side of the middle between the nMOS substructure 40 and the pMOS substructure 50, and the contact-hole formation region 33 is arranged approximately in the middle between the nMOS substructure 40 and the pMOS substructure 50.

Since the contact-hole formation region 33 is displaced from the division region 31, the contact hole can be formed by etching the interlayer insulation film 32, the third etching stopper film 30, the second stressing film 29, and the first etching stopper film 26 in this order. Therefore, it is possible to effectively suppress the etching damage to the silicide region 25 and the occurrence of insufficient overetching. Therefore, only the second stressing film 29 is included as a stressing film in the vicinity of the bottom of the contact-hole formation region 33. However, even in the case where a portion of the first stressing film 27 is included in the contact-hole formation region 33, it is also possible to suppress etching damage to the silicide region 25 and the insufficient overetching and realize a contact structure exhibiting low contact resistance when the area of the portion of the first stressing film 27 included in the contact-hole formation region 33 is equal to or less than a predetermined amount.

Further, in consideration of possible occurrence of the misalignment in the boundary region between first and second stressing films 27 and 29 as illustrated in FIGS. 7 and 8, the contact-hole formation region 33 and the division region 31 are arranged by appropriately setting the thickness of the thick portion of the second stressing film 29 and the amount of the misalignment (i.e., the gap between the first and second stressing films 27 and 29 or the width of overlap of the near-edge portions of the first and second stressing films 27 and 29). Although the division region 31 is arranged on the nMOS-substructure side of the middle between the nMOS substructure 40 and the pMOS substructure 50 in the above example illustrated in FIGS. 9 and 10, alternatively, it is possible to arrange the contact-hole formation region 33 on the pMOS-substructure side of the middle between the nMOS substructure 40 and the pMOS substructure 50 while arranging the division region 31 in the middle between the nMOS substructure 40 and the pMOS substructure 50. Further alternatively, it is also possible to arrange the division region 31 on the nMOS-substructure side, and the contact-hole formation region on the pMOS-substructure side. In practice, it is possible to choose the most advantageous arrangement of the division region 31 and the contact-hole formation region 33 in consideration of the overall arrangement of the circuit containing the CMOS structure 60 which is to be formed.

Third Embodiment

According to the first and second embodiments, the first, second, and third etching stopper films 3, 6, and 7 are used for dividedly forming the first and second stressing films 4 and 5, for example, as illustrated in FIGS. 1 and 6. According to the third embodiment of the present invention, the formation of at least a portion of the first, second, and third etching stopper films 3, 6, and 7 is dispensed with, as explained below.

Figure 11:
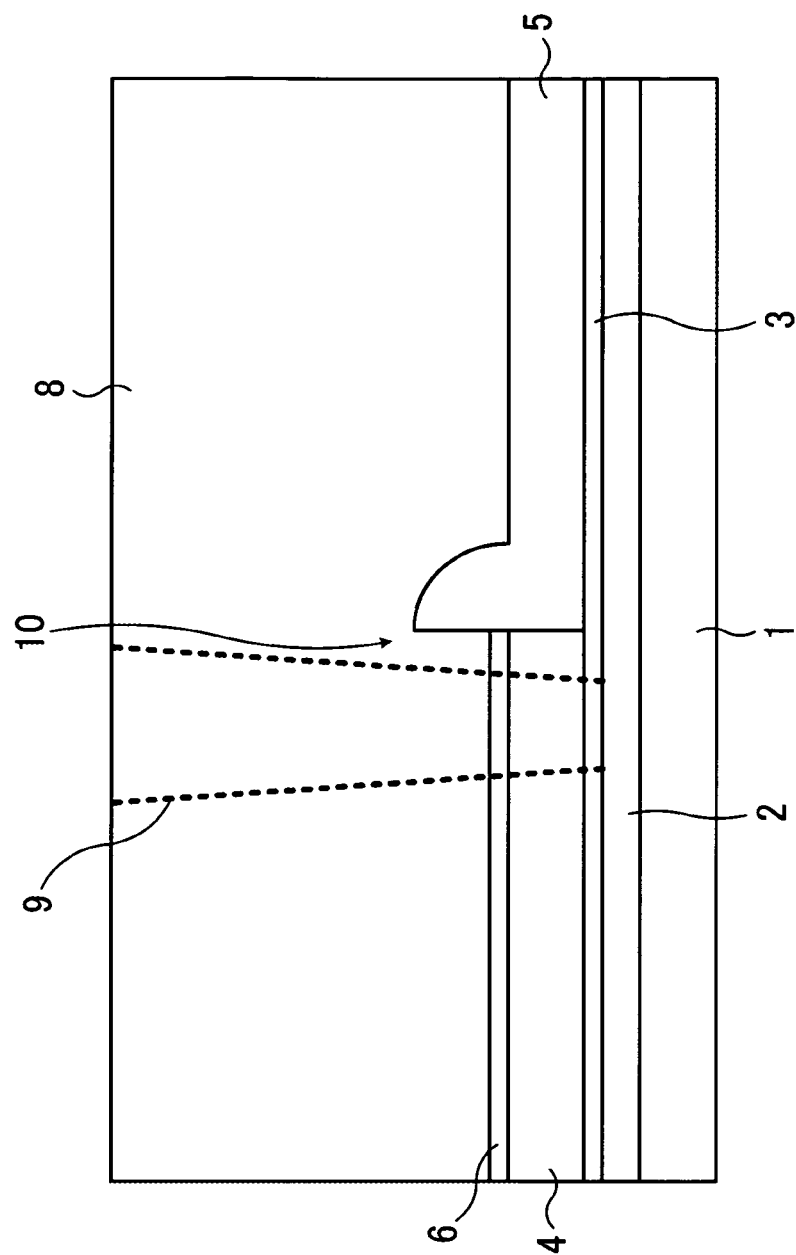
Figure 12:
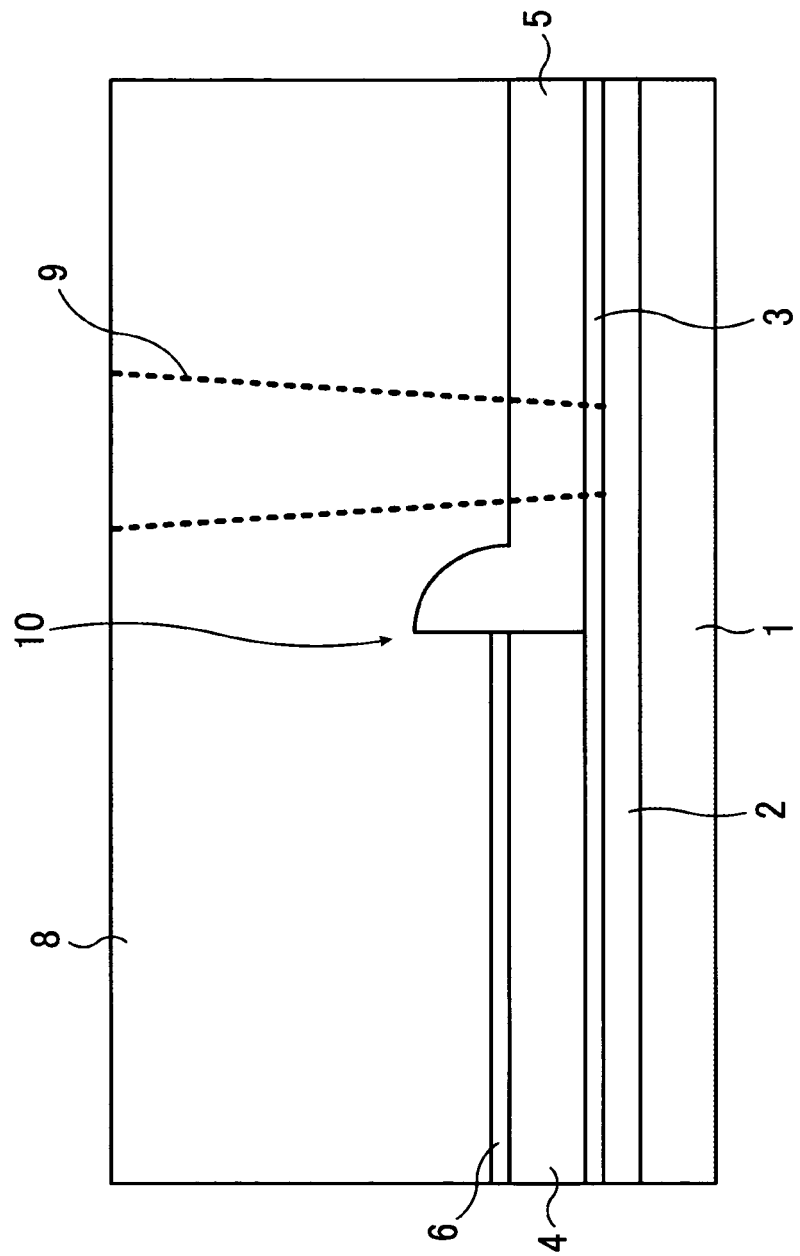
Figure 13:
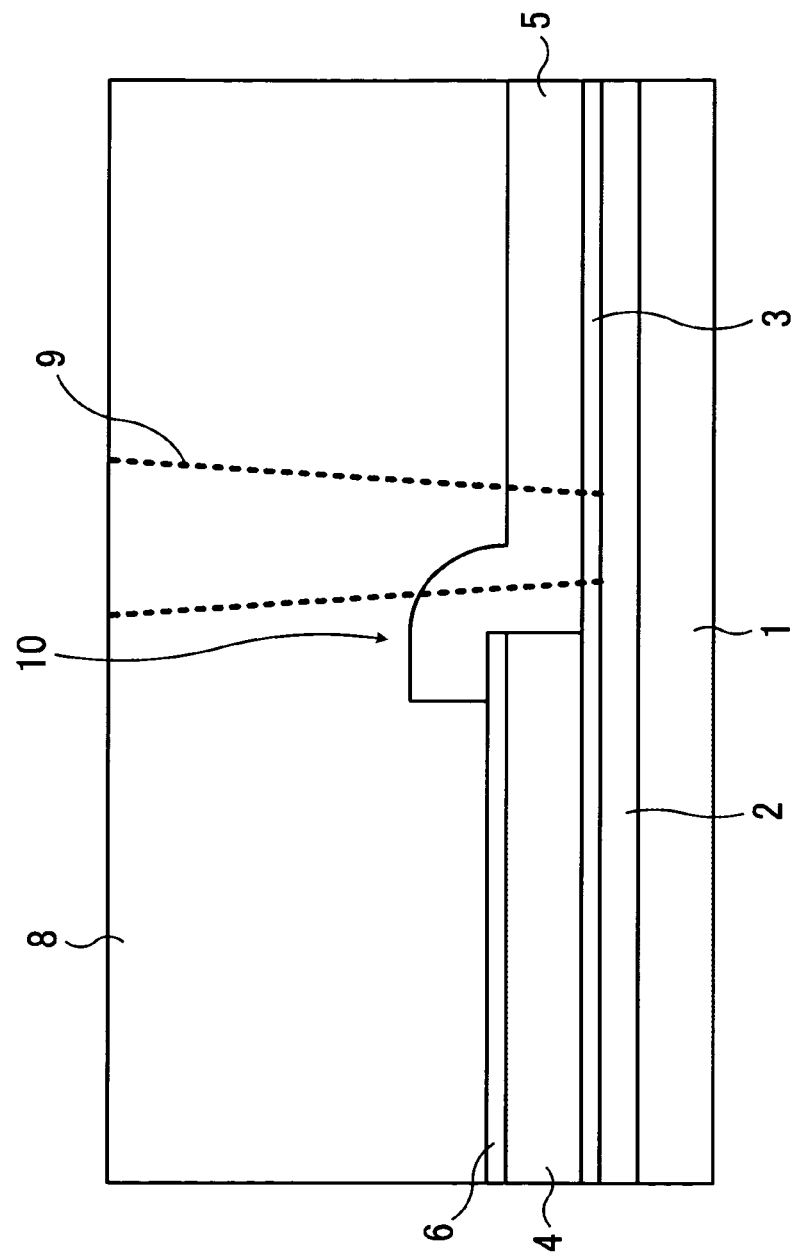

FIGS. 11 to 13 are schematic cross-sectional views of the basic structures of the semiconductor devices according to the third embodiment. In the structures illustrated in FIGS. 11 to 13, the third etching stopper film 7 is not formed. Even in such structures, it is possible to arrange the contact-hole formation region 9 on the first-stressing-film side as illustrated in FIG. 11, or on the second-stressing-film side as illustrated in FIGS. 12 and 13. If the increase in the thickness of the second stressing film 5 in the boundary region is an amount which is allowed in the etching process, the thick portion of the second stressing film 5 may be included in the contact-hole formation region 9 as illustrated in FIG. 13.

In particular, in the case where the contact-hole formation region 9 is arranged on the second-stressing-film side as illustrated in FIGS. 12 and 13, it is possible to avoid etching of the second etching stopper film 6 formed over the first stressing film 4 during formation of the contact hole. In addition, since the third etching stopper film 7 is not formed, it is possible to reduce the number of manufacturing steps. The first and second stressing films 4 and 5 can be dividedly formed without the formation of the third etching stopper film 7 by appropriately choosing an etching technique of the second stressing film 5 and setting the etching conditions of the second stressing film 5 (e.g., appropriately controlling the etching).

Although the third etching stopper film 7 is dispensed with in the structures of FIGS. 11 to 13, alternatively, the second etching stopper film 6 may be dispensed with. The absence of the second etching stopper film 6 is particularly effective in forming the contact hole on the first-stressing-film side. When the second etching stopper film 6 is not formed, the first stressing film 4 behaves as an etching stopper film when the portion of the second stressing film 5 formed on the first stressing film 4 is etched.

Further alternatively, it is possible to dispense with the formation of both of the second and third etching stopper films 6 and 7. Even in this case, it is possible to achieve the advantages of the present invention.

Fourth Embodiment

Figure 14:
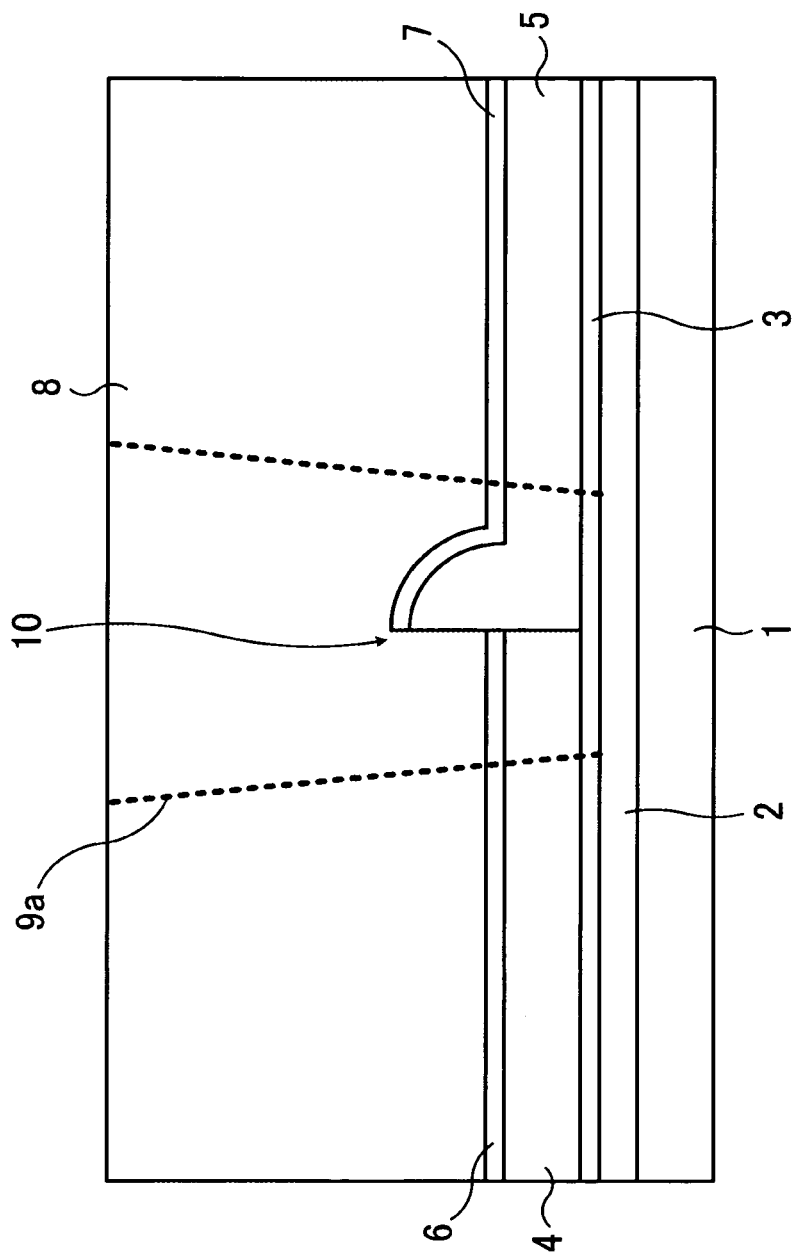
FIG. 14 is a schematic cross-sectional view of the basic structure of a semiconductor device according to a fourth embodiment of the present invention.

FIG. 14 is a schematic cross-sectional view of the basic structure of a semiconductor device according to the fourth embodiment of the present invention.

As illustrated in FIG. 14, the structure according to the fourth embodiment is different from the first embodiment in that the division region 10 between the first and second stressing films 4 and 5 exists in the contact-hole formation region 9a having a great cross-sectional area (opening size). In the case where the cross-sectional area of the contact-hole formation region 9a is sufficiently great, even when the division region 10 is included in the contact-hole formation region 9a, the cross-sectional area other than the area of the thick portion of the second stressing film 5 is still great. Therefore, even when etching of the thick portion is imperfect, the opening formed through the cross section other than the thick portion is sufficiently great, so that it is possible to realize satisfactory electric connection to the gate electrode 1 through the contact electrode formed in the contact-hole formation region 9a.

In the above structure, the cross section of the contact hole near the bottom may have a shape (e.g., an approximately rectangular or elliptic shape) which is elongated in the longitudinal direction of the gate electrode 1 and the silicide region 2. In addition, it is preferable that the cross-sectional area of the stressing films other than the thick portion of the second stressing film 5 be equal to or greater than 50% of the entire cross-sectional area of the contact hole.

Even in the case where the near-edge portions of the first and second stressing films 4 and 5 overlap or a gap is produced between the edges of the first and second stressing films 4 and 5, the semiconductor device according to the fourth embodiment having the structure described above is effective when the cross section of the contact hole near the bottom has the above-mentioned shape and the total cross-sectional area of the stressing films other than the area of the thick portion of the second stressing film 5, the overlapping portion of the first and second stressing films 4 and 5, and the gap between the first and second stressing films 4 and 5 is equal to or greater than a predetermined amount.

Further, it is possible to combine the characteristic features of the semiconductor device according to the fourth embodiment with the characteristic features of the first to third embodiments.

Fifth Embodiment

Figure 15:
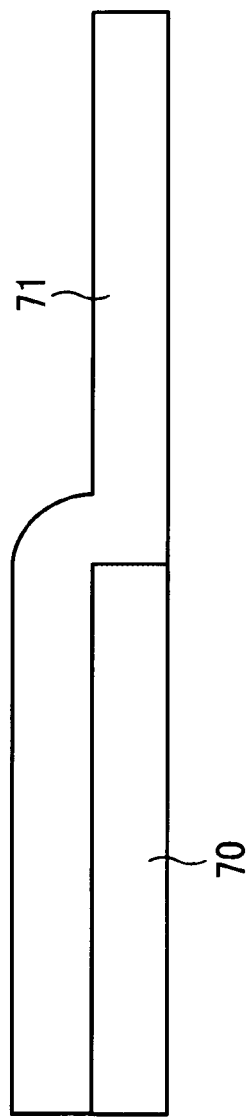
FIGS. 15 to 16 are schematic cross-sectional views of essential layers formed in intermediate steps in a process for producing a semiconductor device according to a fifth embodiment of the present invention.
Figure 16:
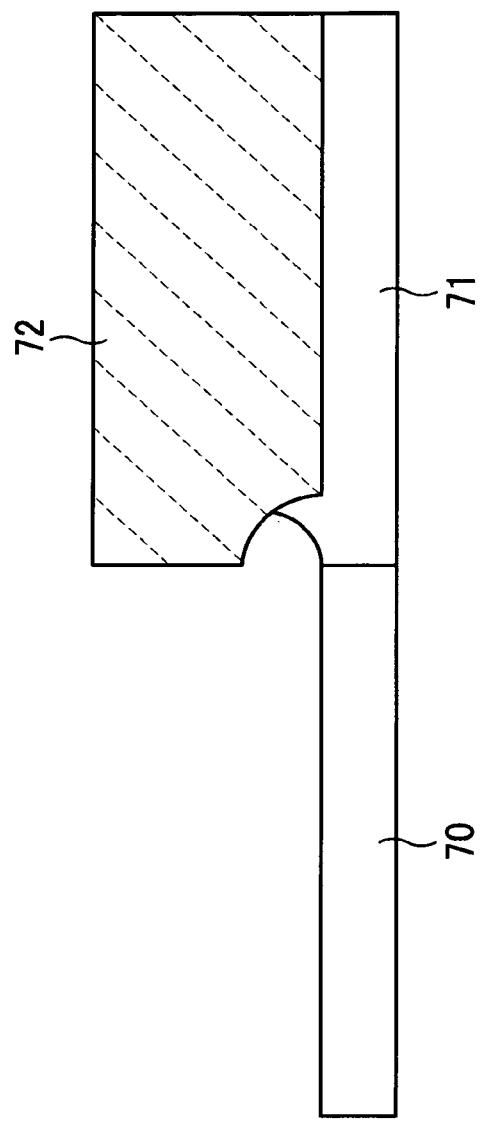

FIGS. 15 to 16 are schematic cross-sectional views of essential layers formed in intermediate steps in a process for producing a semiconductor device according to the fifth embodiment of the present invention. In FIGS. 15 to 16, reference number 70 denotes a first stressing film, 71 denotes a second stressing film, and 72 denotes a resist layer. The layers illustrated in FIG. 15 are formed in the following steps (a) to (c).

(a) The first stressing film 70 is formed over an underlying layered structure (not shown).

(b) The portion of the first stressing film 70 located in a region in which the second stressing film 71 is to be formed is removed by patterning and etching.

(c) The second stressing film 71 is formed over the structure after the removal of the portion of the first stressing film 70. Thereafter, the portion of the second stressing film 71 formed on the remaining portion of the first stressing film 70 is removed so that the first and second stressing films 70 and 71 are dividedly formed in different regions.

For example, the operation in the above step (b) is realized in the following substeps (b1) and (b2).

(b1) The resist layer 72 is formed on a portion of the second stressing film 71 so that the portion of the second stressing film 71 formed on the remaining portion of the first stressing film 70 is exposed.

(b2) The exposed portion of the second stressing film 71 is removed by using the resist layer 72 as a mask and performing isotropic etching as illustrated in FIG. 16. The isotropic etching may be either wet etching or dry etching.

In the case where the isotropic etching is performed as above, the thick portion of the second stressing film 71 (located in the boundary region between first and second stressing films 70 and 71) is etched as well as the exposed portion of the second stressing film 71 as illustrated in FIG. 16, so that the excessive thickness of the thick portion of the second stressing film 71 is eliminated or reduced. Therefore, even in the case where the contact-hole formation region is arranged to include the boundary region, it is possible to suppress etching damage to a layer underlying the second stressing film 71 or occurrence of insufficient formation of the contact hole (opening).

Figure 17:
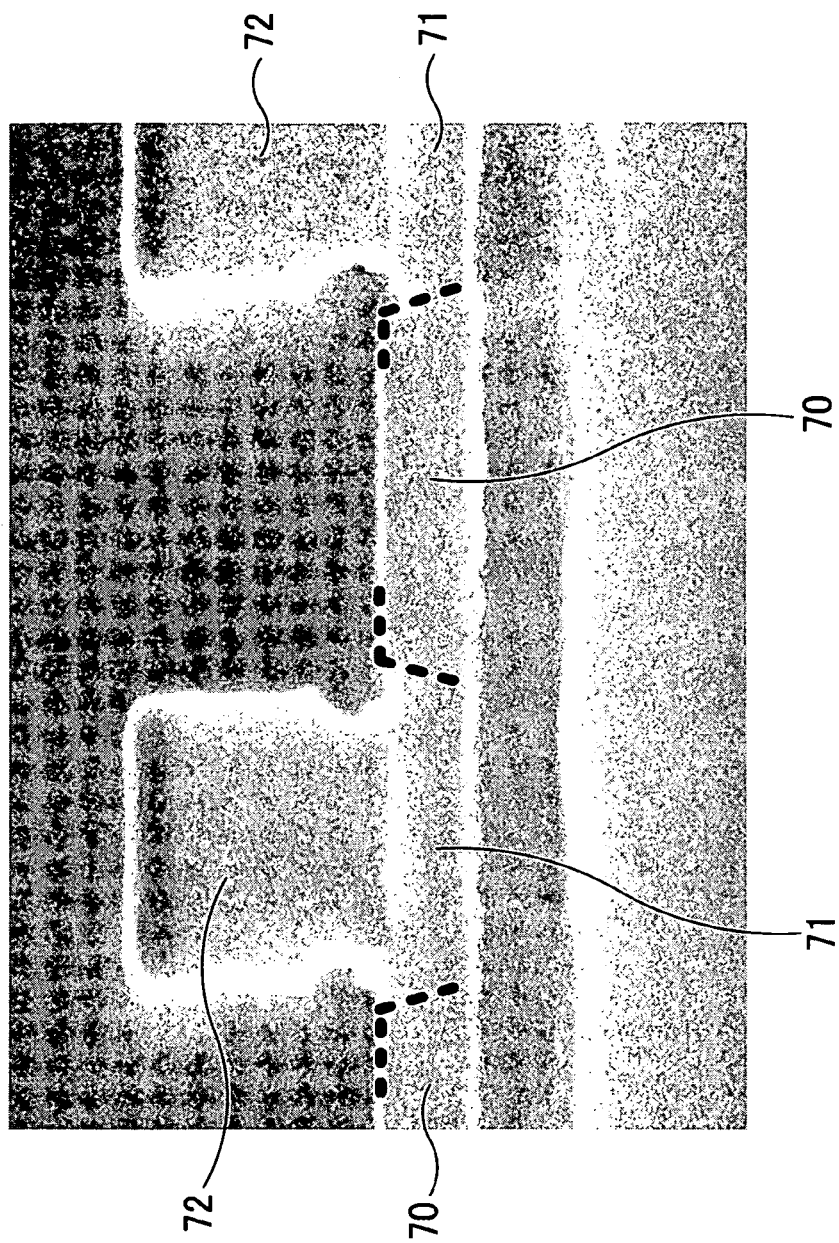
FIG. 17 is an electron micrograph of a cross section of a structure in which stressing films and a resist layer are formed, and isotropic etching is performed by use of the resist layer as a mask.
Figure 19A:
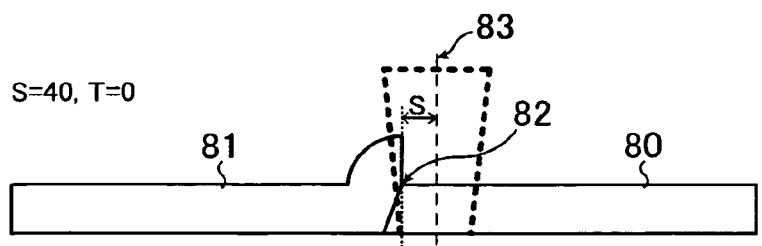
FIGS. 19A to 19F are schematic cross-sectional views of examples of a second type of arrangement of stressing films and a contact-hole formation region in the stage before formation of a contact hole, where the stressing films are dividedly formed by use of anisotropic etching without use of isotropic etching.
Figure 19B:
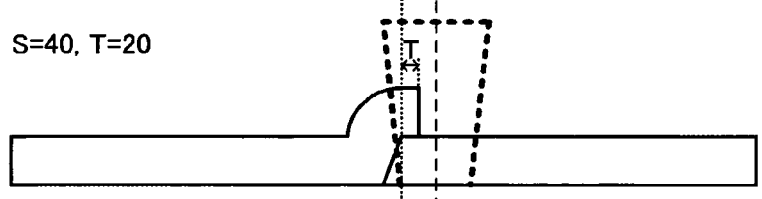
Figure 19C:
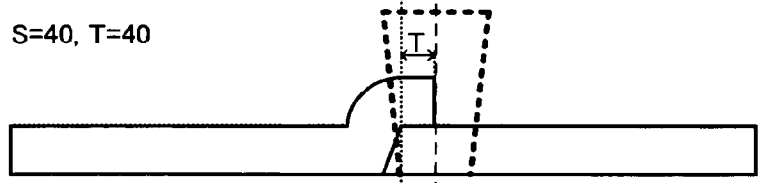
Figure 19D:
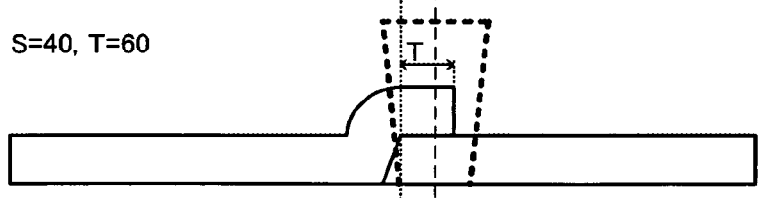
Figure 19E:
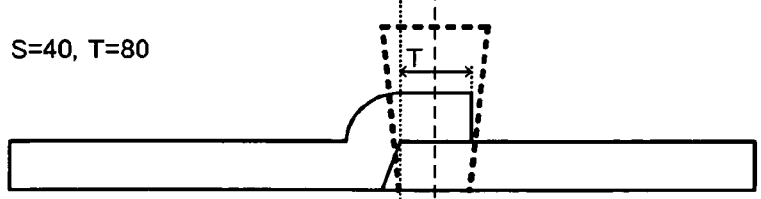
Figure 19F:
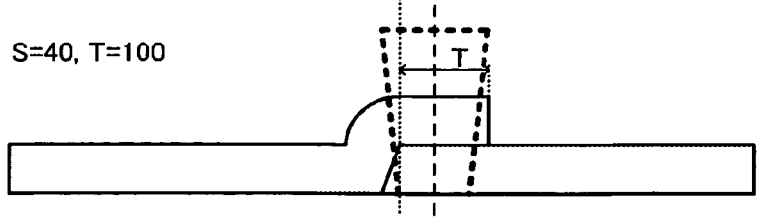
Figure 20A:
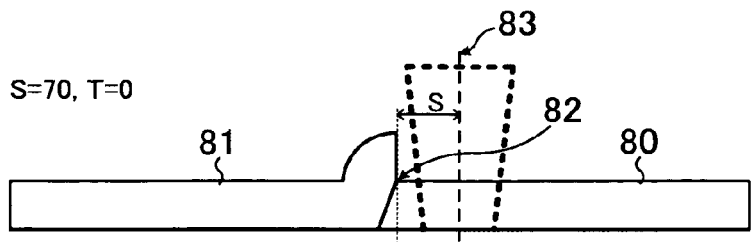
FIGS. 20A to 20F are schematic cross-sectional views of examples of a third type of arrangement of stressing films and a contact-hole formation region in the stage before formation of a contact hole, where the stressing films are dividedly formed by use of anisotropic etching without use of isotropic etching.
Figure 20B:
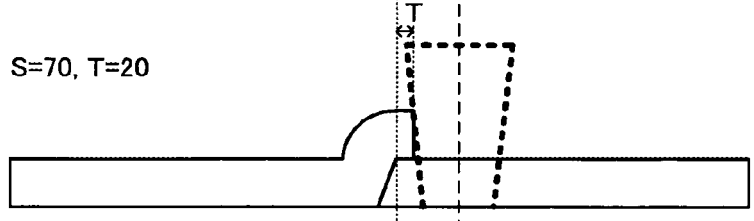
Figure 20C:
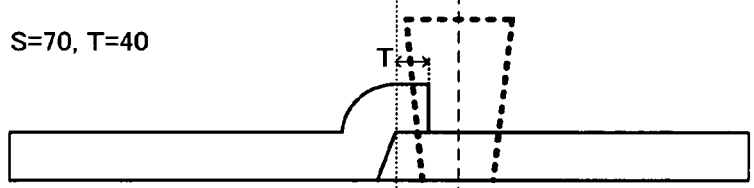
Figure 20D:
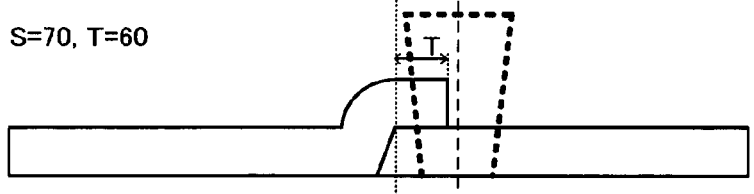
Figure 20E:
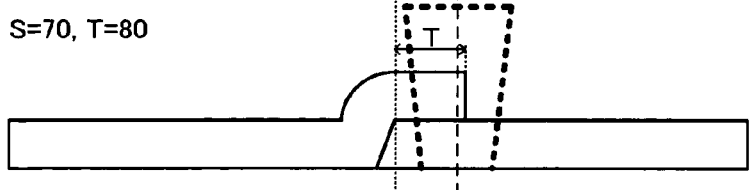
Figure 20F:
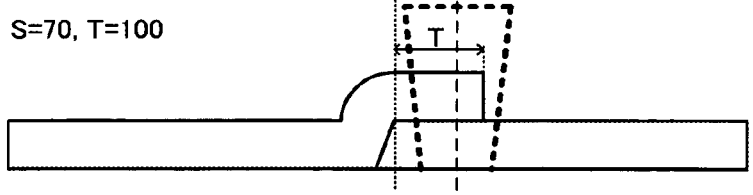
Figure 21A:
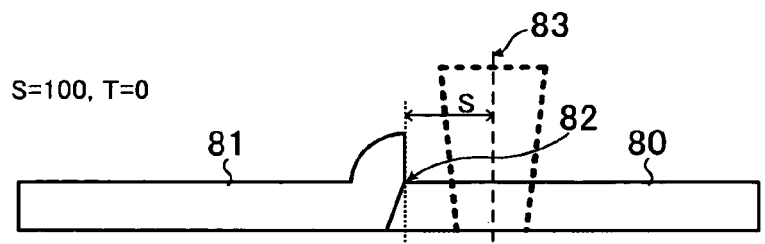
FIGS. 21A to 21F are schematic cross-sectional views of examples of a fourth type of arrangement of stressing films and a contact-hole formation region in the stage before formation of a contact hole, where the stressing films are dividedly formed by use of anisotropic etching without use of isotropic etching.
Figure 21B:
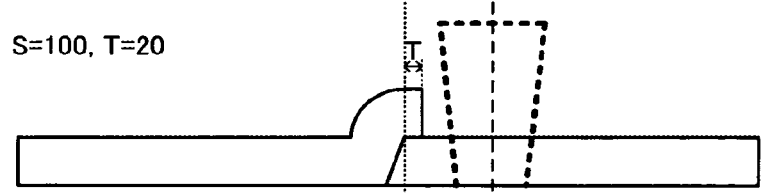
Figure 21C:
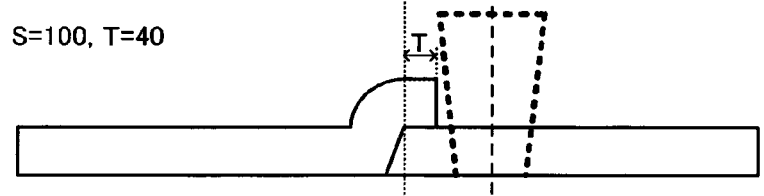
Figure 21D:
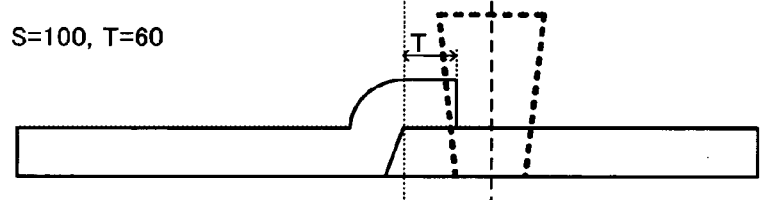
Figure 21E:
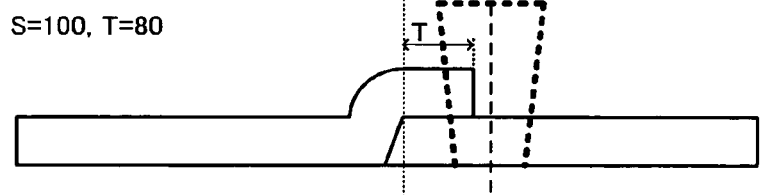
Figure 21F:
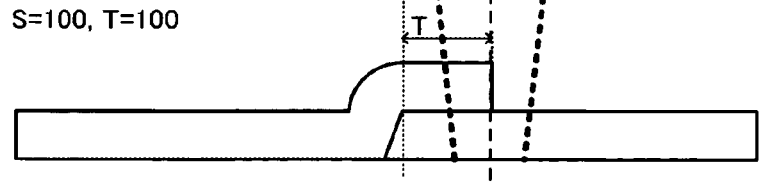
Figure 22A:
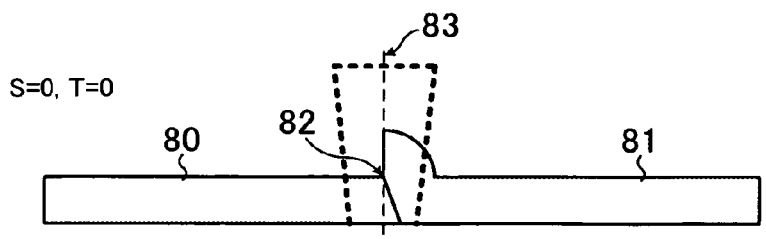
FIGS. 22A to 22F are schematic cross-sectional views of examples of a fifth type of arrangement of stressing films and a contact-hole formation region in the stage before formation of a contact hole, where the stressing films are dividedly formed by use of anisotropic etching without use of isotropic etching.
Figure 22B:
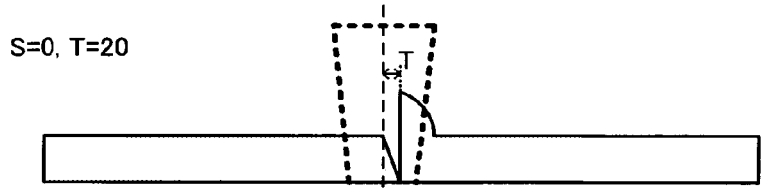
Figure 22C:
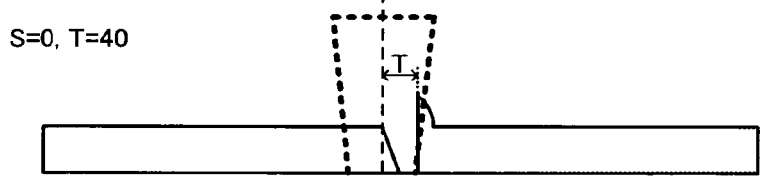
Figure 22D:
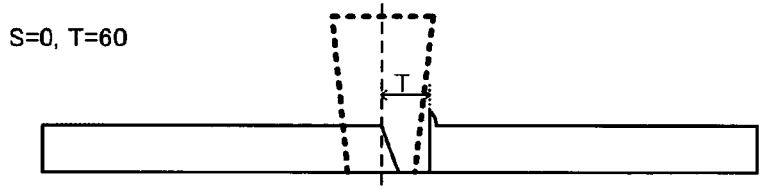
Figure 22E:
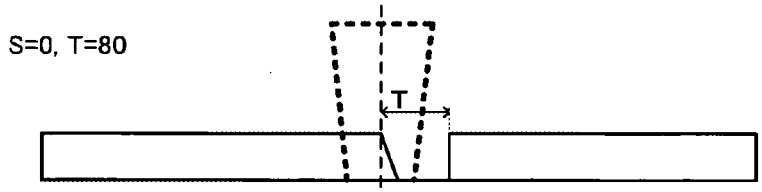
Figure 22F:
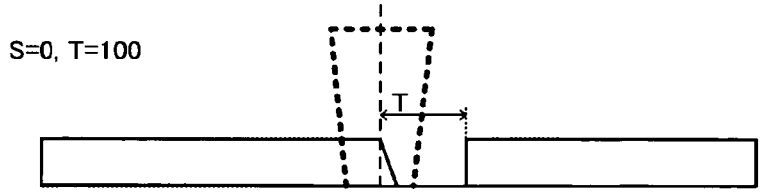
Figure 23A:
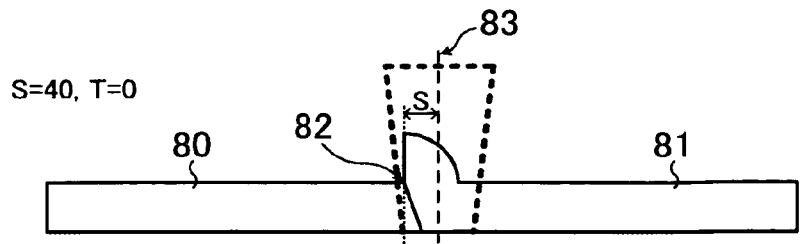
FIGS. 23A to 23F are schematic cross-sectional views of examples of a sixth type of arrangement of stressing films and a contact-hole formation region in the stage before formation of a contact hole, where the stressing films are dividedly formed by use of anisotropic etching without use of isotropic etching.
Figure 23B:
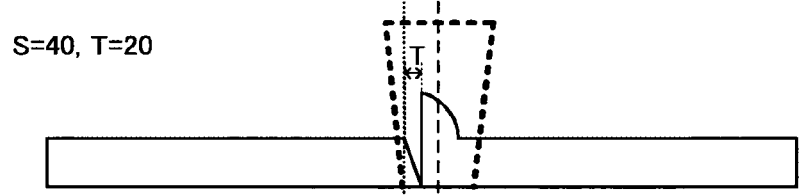
Figure 23C:
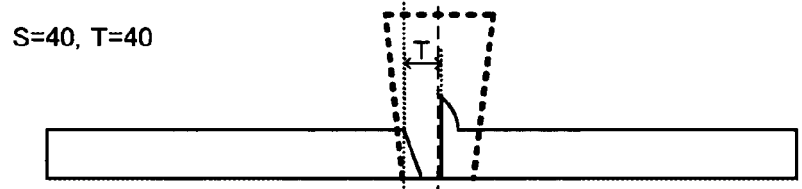
Figure 23D:
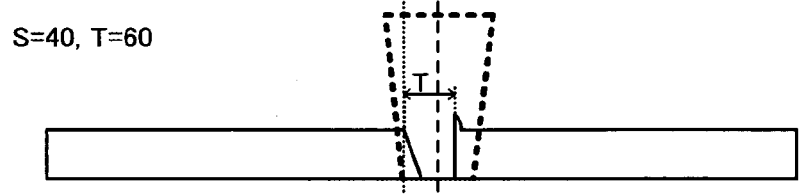
Figure 23E:
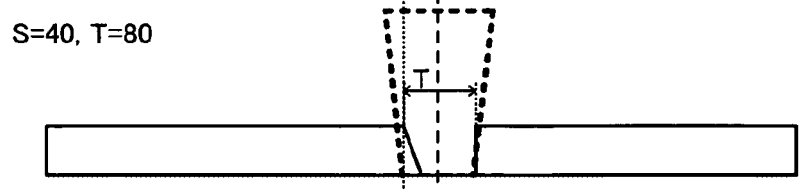
Figure 23F:
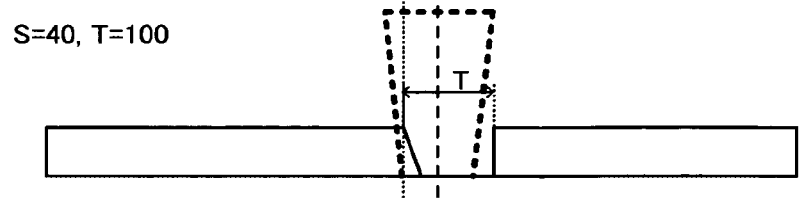

FIG. 17 is an electron micrograph of a cross section of a structure in which the first and second stressing films 70 and 71 and the resist layer 72 are formed and isotropic etching is performed as illustrated in FIGS. 15 and 16. FIG. 17 shows that the thick portion of the second stressing film 71, which exists in the boundary region before the isotropic etching, is eliminated by the isotropic etching performed after formation of the resist layer 72. Therefore, it is possible to dividedly form the first and second stressing films 70 and 71 so as to have flat upper surfaces.

Even in the case where a portion of the resist layer 72 is formed over a near-edge portion of the first stressing film 70, the isotropic etching can reduce the overlap of the second stressing film 71 on the first stressing film 70. Therefore, it is also possible to achieve the effect of flattening the upper surfaces of the first and second stressing films 70 and 71 which are dividedly formed. In particular, in the case where the width of the portion of the resist layer 72 formed over the near-edge portion of the first stressing film 70 is smaller than the thickness of the second stressing film 71, the use of the isotropic etching according to the fifth embodiment is more effective. Further, even in the case where the resist layer 72 formed on the second stressing film 71 does not cover the thick portion of the second stressing film 71, the isotropic etching can also achieve the above effect of flattening the upper surfaces of the first and second stressing films 70 and 71 which are dividedly formed.

Furthermore, it is possible to combine the characteristic features of the semiconductor device according to the fifth embodiment with the characteristic features of the first to fourth embodiments.

The advantages of the use of the isotropic etching are further explained below.

FIGS. 18A to 33F are schematic cross-sectional views of examples of arrangement of stressing films and a contact-hole formation region in a boundary region in the stage before formation of a contact hole. In FIGS. 18A to 33F, reference number 80 denotes a first stressing film, 81 denotes a second stressing film, 82 denotes the edge of the upper surface of the first stressing film 80, and 83 denotes a contact-hole formation region.

In the structures illustrated in FIGS. 18A to 25F, the stressing films are dividedly formed by use of anisotropic etching without use of isotropic etching. In the structures illustrated in FIGS. 26A to 33F, the stressing films are dividedly formed by use of anisotropic etching and isotropic etching. FIGS. 26A to 33F respectively correspond to FIGS. 18A to 25F, and are different from FIGS. 18A to 25F only in that the isotropic etching is performed in formation of the structures of FIGS. 26A to 33F.

In the structures illustrated in FIGS. 18A to 21F and FIGS. 26A to 29F, the contact holes are arranged at positions shifted by various amounts from the edge 82 of the upper surface of the first stressing film 80 toward the first-stressing-film side. In the structures illustrated in FIGS. 22A to 25F and FIGS. 30A to 33F, the contact holes are arranged at positions shifted by various amounts from the edge 82 of the upper surface of the first stressing film 80 toward the second-stressing-film side. In FIGS. 18A to 33F, the distances S from the edge 82 of the upper surface of the first stressing film 80 to the center of the contact hole 83 are 0, 40, 70, and 100 nanometers.

In FIGS. 18A to 25F, the distances T from the edge 82 of the upper surface of the first stressing film 80 to the edge of the second stressing film 81 in the arrangements illustrated in each set of partial figures (e.g., the set of FIGS. 18A to 18F) bearing figure numbers constituted by an identical number (one of "18" to "25") and the capital letters "A", "B", "C", "D", "E" and "F" are 0, 20, 40, 60, 80, and 100 nanometers, respectively. In addition, in FIGS. 26A to 33F, the values of the distances T in the respectively corresponding structures illustrated in FIGS. 18A to 25F are indicated.

As illustrated in FIGS. 18A to 33F, when the arrangement of the contact hole and the stressing films is changed, the position of the contact-hole formation region 83 can be varied so that the contact-hole formation region 83 can include one of the stressing films, or an overlap of the second stressing film 81 and the first stressing film 80 or a gap between the first stressing film 80 and the second stressing film 81. As mentioned before, a layout in which the contact-hole formation region and the division region are arranged in different positions can be realized by arranging the contact-hole formation region so as to include only one stressing film in an entire cross section of the contact-hole formation region or in a major part of the cross section of the contact-hole formation region, or by resetting the opening size of the contact hole.

In the case where the isotropic etching is not performed, the boundaries between the first stressing film 80 and the second stressing film 81, the thick portions of the second stressing film 81, or gaps between the first stressing film 80 and the second stressing film 81 in the contact-hole formation regions 83 has a cross section as illustrated in each of FIGS. 18A to 25F. On the other hand, in the case where the isotropic etching is performed according to the fifth embodiment, the arrangements as illustrated in FIGS. 26A to 33F are formed based on the same layouts as the arrangements of FIGS. 18A to 25F, respectively.

Figure 26A:
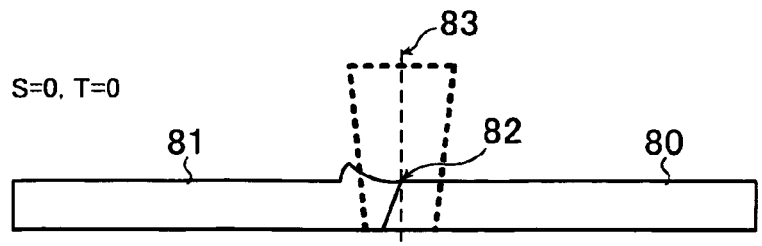
FIGS. 26A to 26F are schematic cross-sectional views of examples of a ninth type of arrangement of stressing films and a contact-hole formation region in the stage before formation of a contact hole, where the stressing films are dividedly formed by use of anisotropic etching and isotropic etching.
Figure 26B:
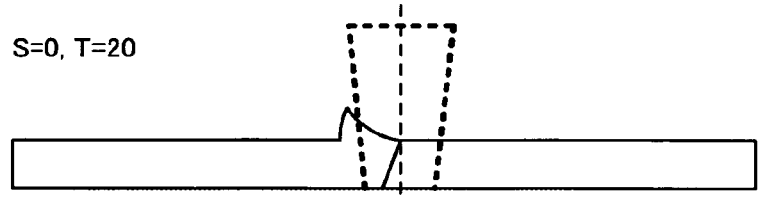
Figure 26C:
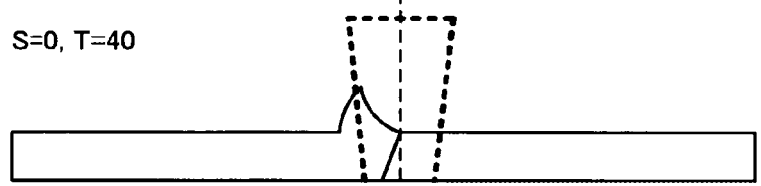
Figure 26D:
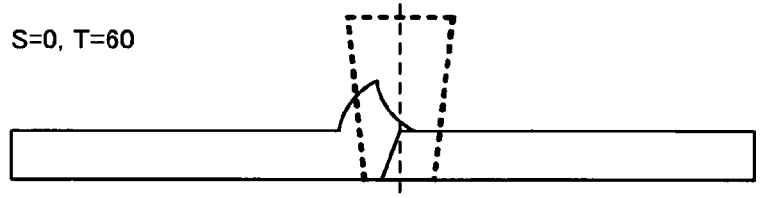
Figure 26E:
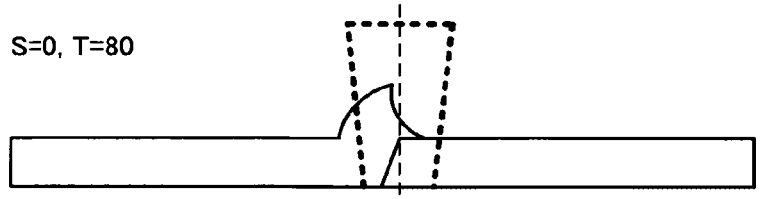
Figure 26F:
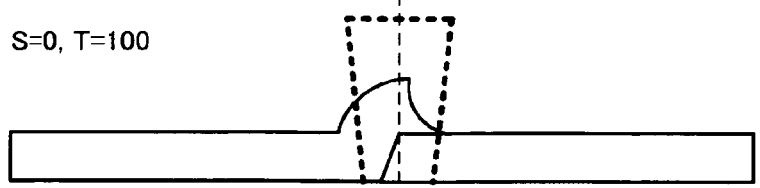
Figure 27A:
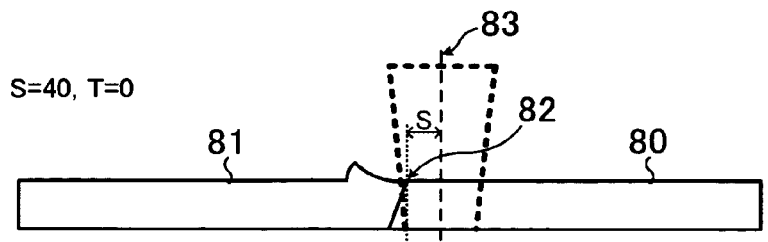
FIGS. 27A to 27F are schematic cross-sectional views of examples of a tenth type of arrangement of stressing films and a contact-hole formation region in the stage before formation of a contact hole, where the stressing films are dividedly formed by use of anisotropic etching and isotropic etching.
Figure 27B:
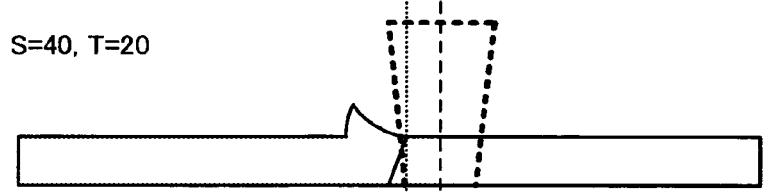
Figure 27C:
Figure 27D:
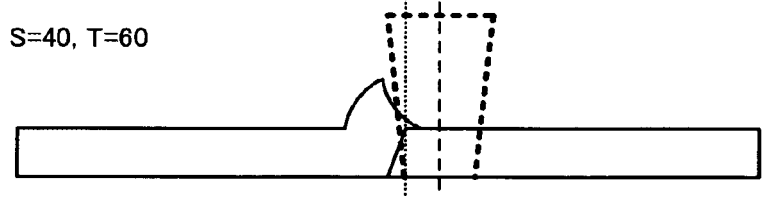
Figure 27E:
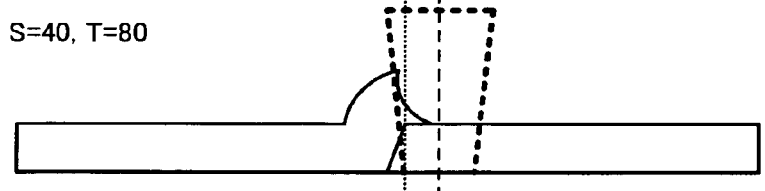
Figure 27F:
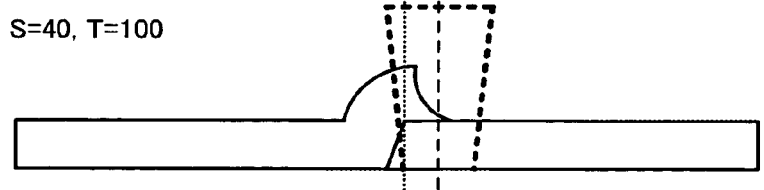
Figure 28A:
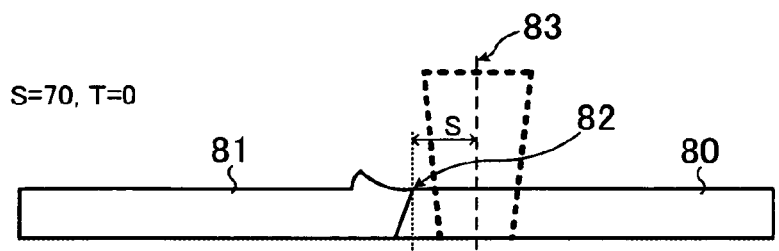
FIGS. 28A to 28F are schematic cross-sectional views of examples of an eleventh type of arrangement of stressing films and a contact-hole formation region in the stage before formation of a contact hole, where the stressing films are dividedly formed by use of anisotropic etching and isotropic etching.
Figure 28B:
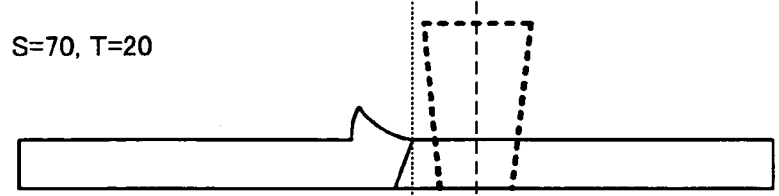
Figure 28C:
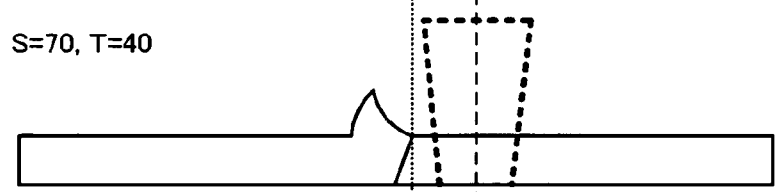
Figure 28D:
Figure 28E:
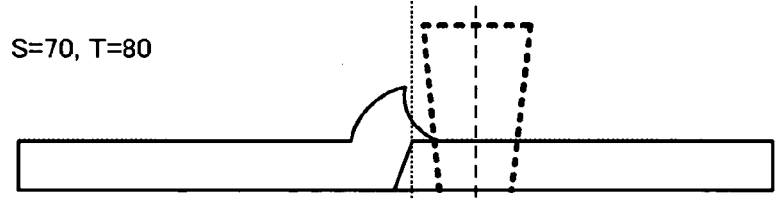
Figure 28F:
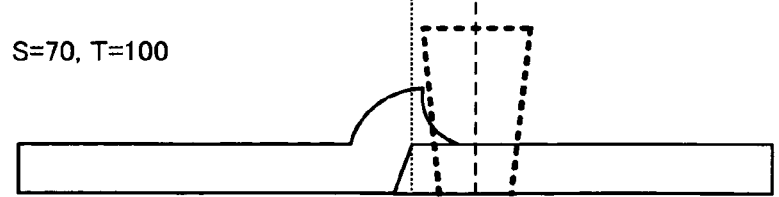
Figure 29A:
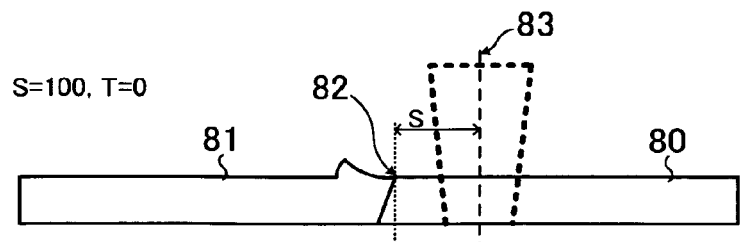
FIGS. 29A to 29F are schematic cross-sectional views of examples of a twelfth type of arrangement of stressing films and a contact-hole formation region in the stage before formation of a contact hole, where the stressing films are dividedly formed by use of anisotropic etching and isotropic etching.
Figure 29B:
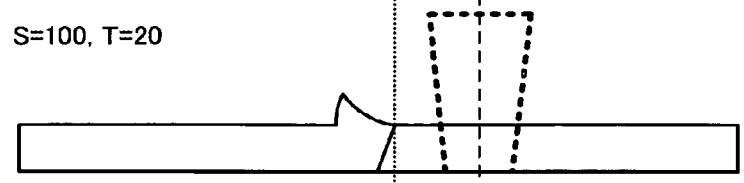
Figure 29C:
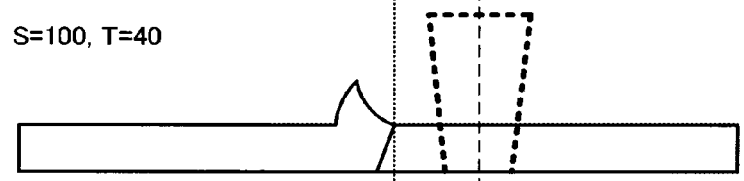
Figure 29D:
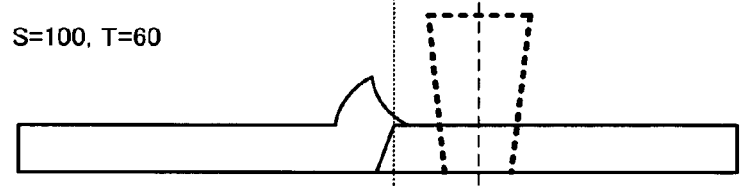
Figure 29E:
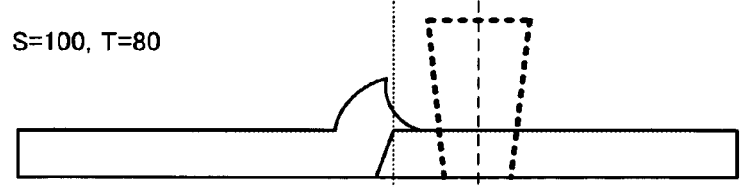
Figure 29F:
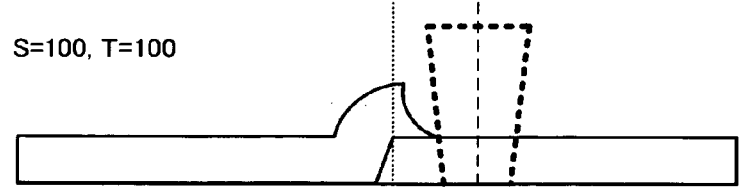
Figure 30A:
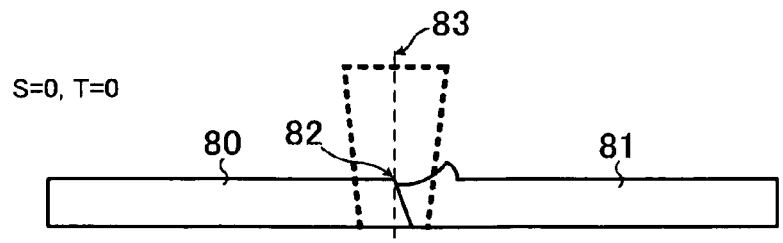
FIGS. 30A to 30F are schematic cross-sectional views of examples of a thirteenth type of arrangement of stressing films and a contact-hole formation region in the stage before formation of a contact hole, where the stressing films are dividedly formed by use of anisotropic etching and isotropic etching.
Figure 30B:
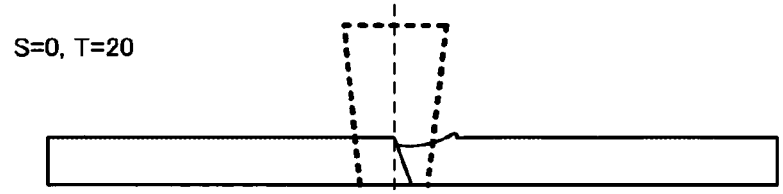
Figure 30C:
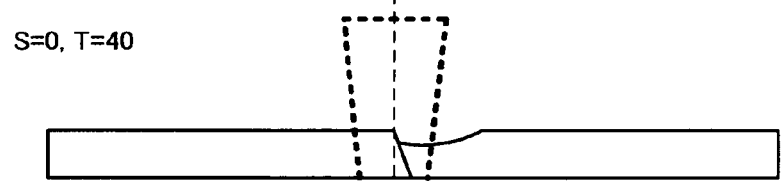
Figure 30D:
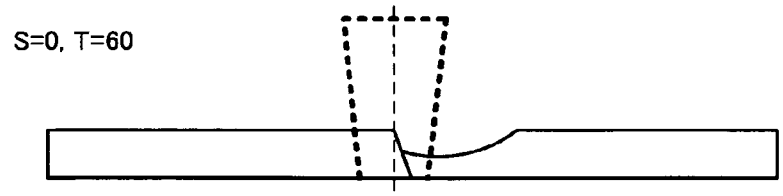
Figure 30E:
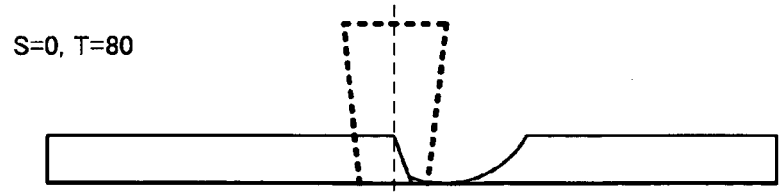
Figure 30F:
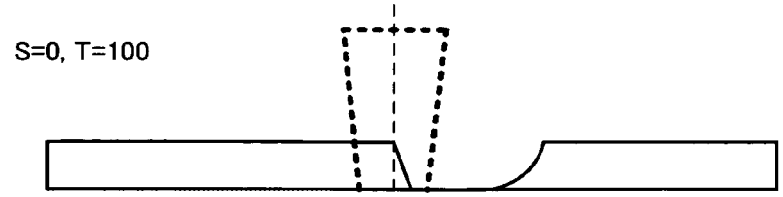
Figure 31A:
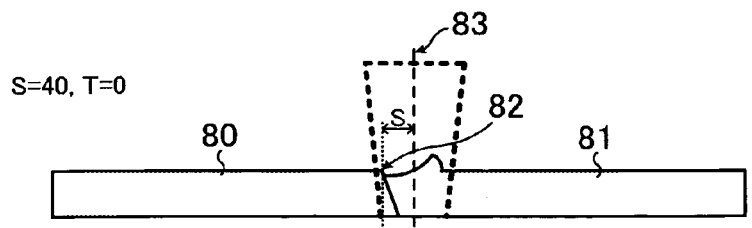
FIGS. 31A to 31F are schematic cross-sectional views of examples of a fourteenth type of arrangement of stressing films and a contact-hole formation region in the stage before formation of a contact hole, where the stressing films are dividedly formed by use of anisotropic etching and isotropic etching.
Figure 31B:
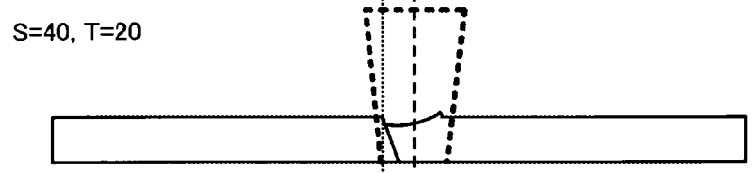
Figure 31C:
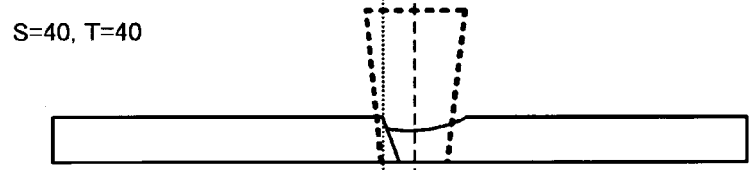
Figure 31D:
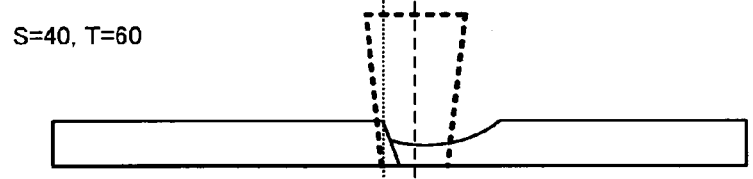
Figure 31E:
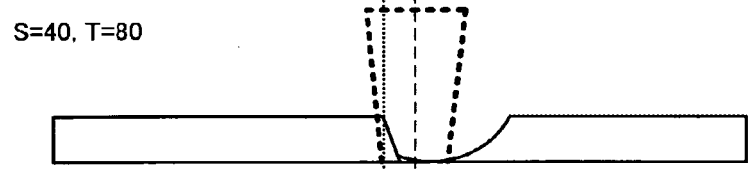
Figure 31F:
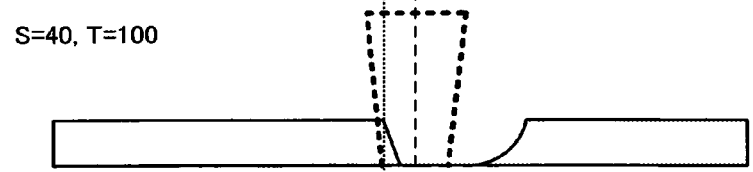

For example, in the arrangement of FIG. 18B (in which isotropic etching is not performed, and S=0, and T=20), the width of the overlap of the second stressing film 81 on the first stressing film 80 in the contact-hole formation region becomes approximately 20 nm. On the other hand, when the isotropic etching is performed before formation of the contact hole, it is possible to form a contact hole under the condition that the stressing films have almost flat upper surfaces in the contact-hole formation region as illustrated in FIG. 26B.

Figure 24A:
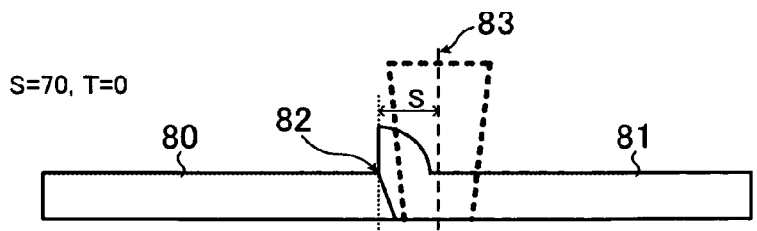
FIGS. 24A to 24F are schematic cross-sectional views of examples of a seventh type of arrangement of stressing films and a contact-hole formation region in the stage before formation of a contact hole, where the stressing films are dividedly formed by use of anisotropic etching without use of isotropic etching.
Figure 24B:
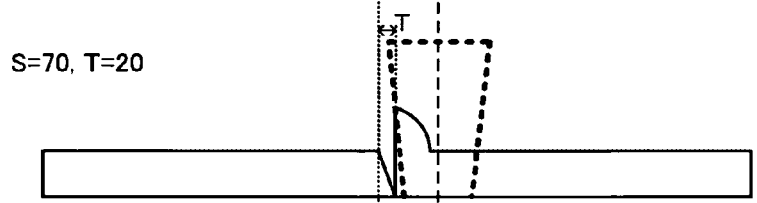
Figure 24C:
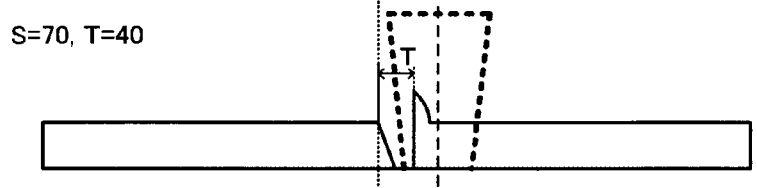
Figure 24D:
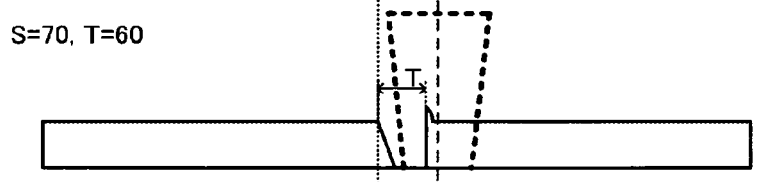
Figure 24E:
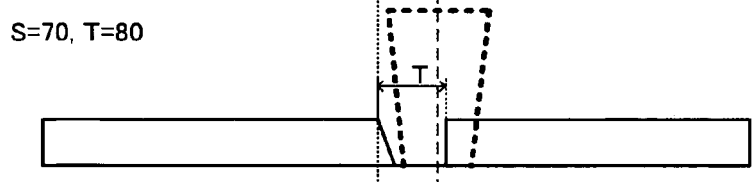
Figure 24F:
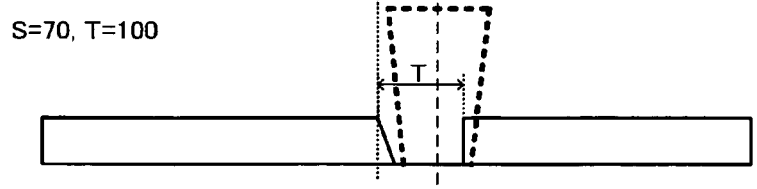
Figure 32A:
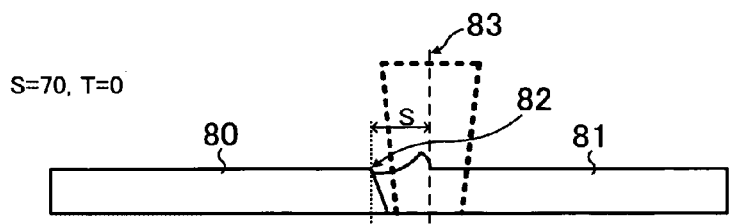
FIGS. 32A to 32F are schematic cross-sectional views of examples of a fifteenth type of arrangement of stressing films and a contact-hole formation region in the stage before formation of a contact hole, where the stressing films are dividedly formed by use of anisotropic etching and isotropic etching.
Figure 32B:
Figure 32C:
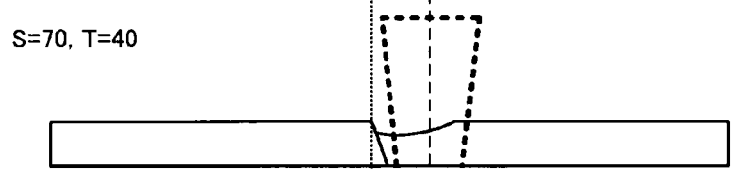
Figure 32D:
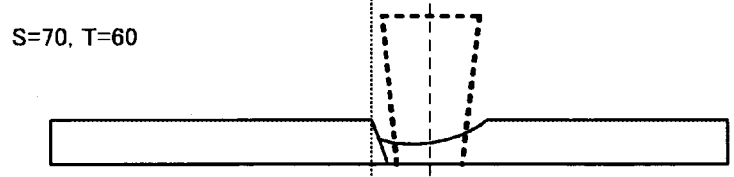
Figure 32E:
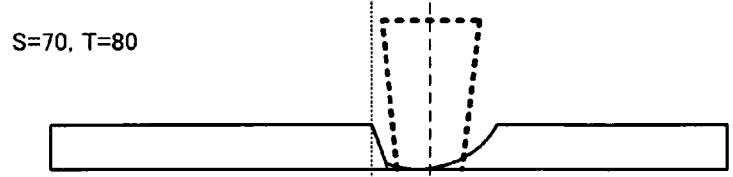
Figure 32F:
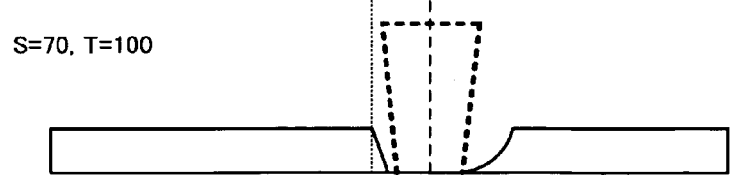
Figure 33A:
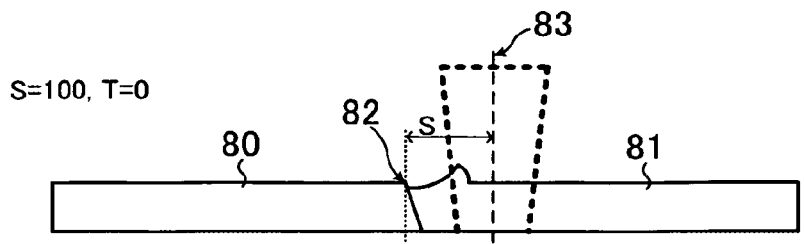
FIGS. 33A to 33F are schematic cross-sectional views of examples of a sixteenth type of arrangement of stressing films and a contact-hole formation region in the stage before formation of a contact hole, where the stressing films are dividedly formed by use of anisotropic etching and isotropic etching.
Figure 33B:
Figure 33C:
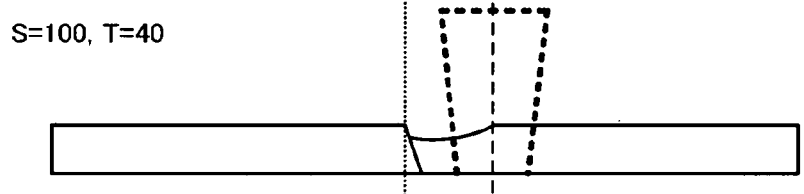
Figure 33D:
Figure 33E:
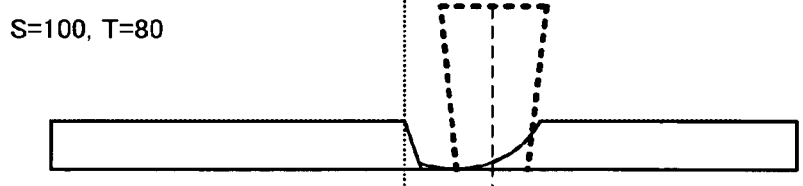
Figure 33F:
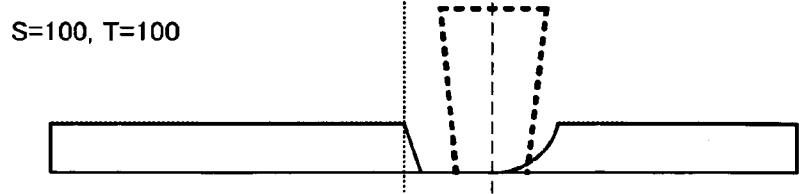

Further, in the arrangement of FIG. 24D (in which isotropic etching is not performed, and S=70, and T=60), the gap between the second stressing film 81 and the first stressing film 80 in the contact-hole formation region becomes approximately 35 nm. On the other hand, when the isotropic etching is performed before formation of the contact hole, it is possible to form a contact hole under the condition that the contact-hole formation region includes no gap between first stressing film 80 and the second stressing film 81, and the stressing films have almost flat upper surfaces in the contact-hole formation region, as illustrated in FIG. 32D.

Figure 34:
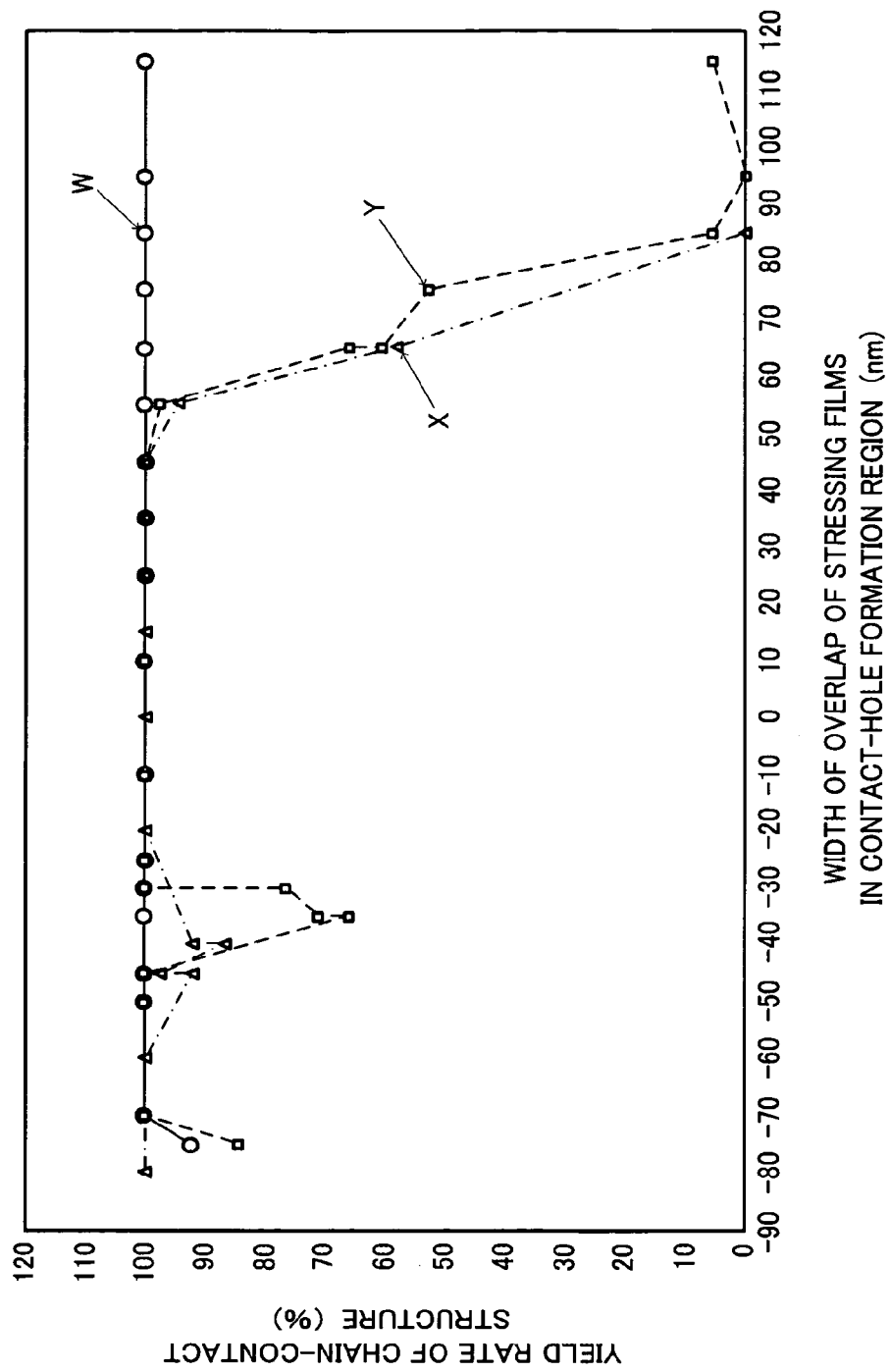
FIG. 34 is a graph indicating a relationship between the arrangement of stressing films and the yield rate.
Figure 35:
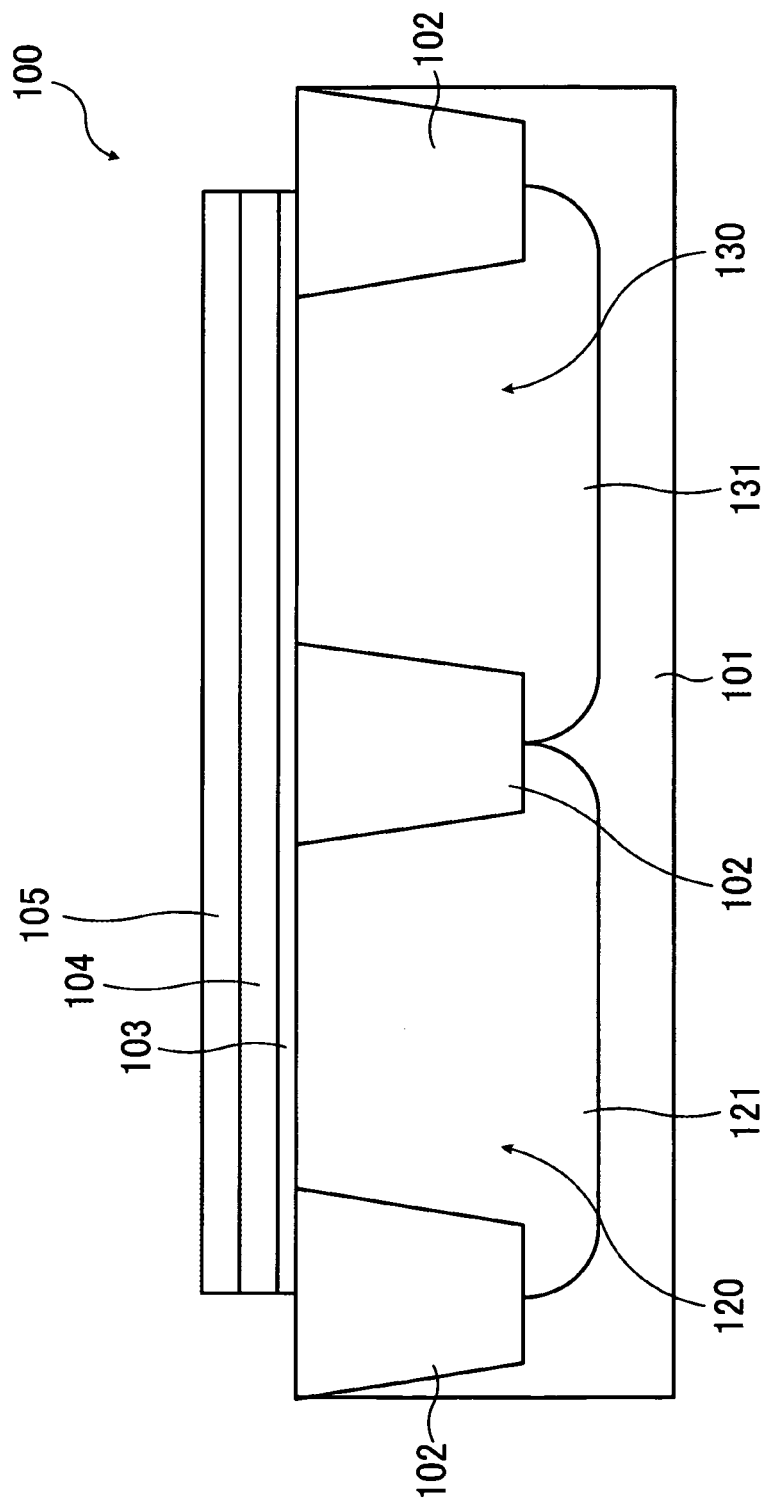
FIG. 35 is a schematic cross-sectional view of an essential portion of a CMOS structure in a stage before formation of stressing films.
Figure 36:
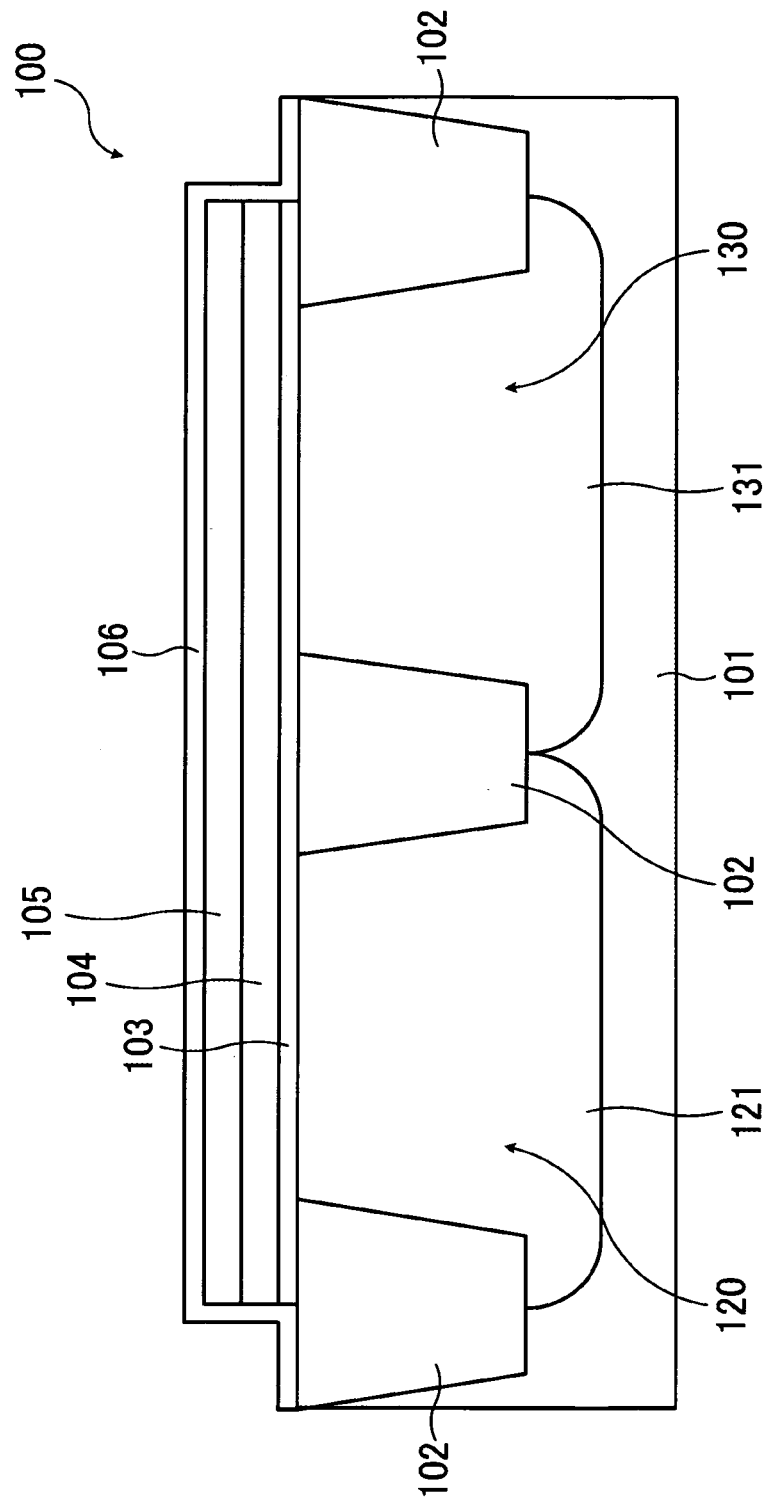
FIG. 36 is a schematic cross-sectional view of the essential portion of the CMOS structure in a stage in which a first etching stopper film is formed.
Figure 37:
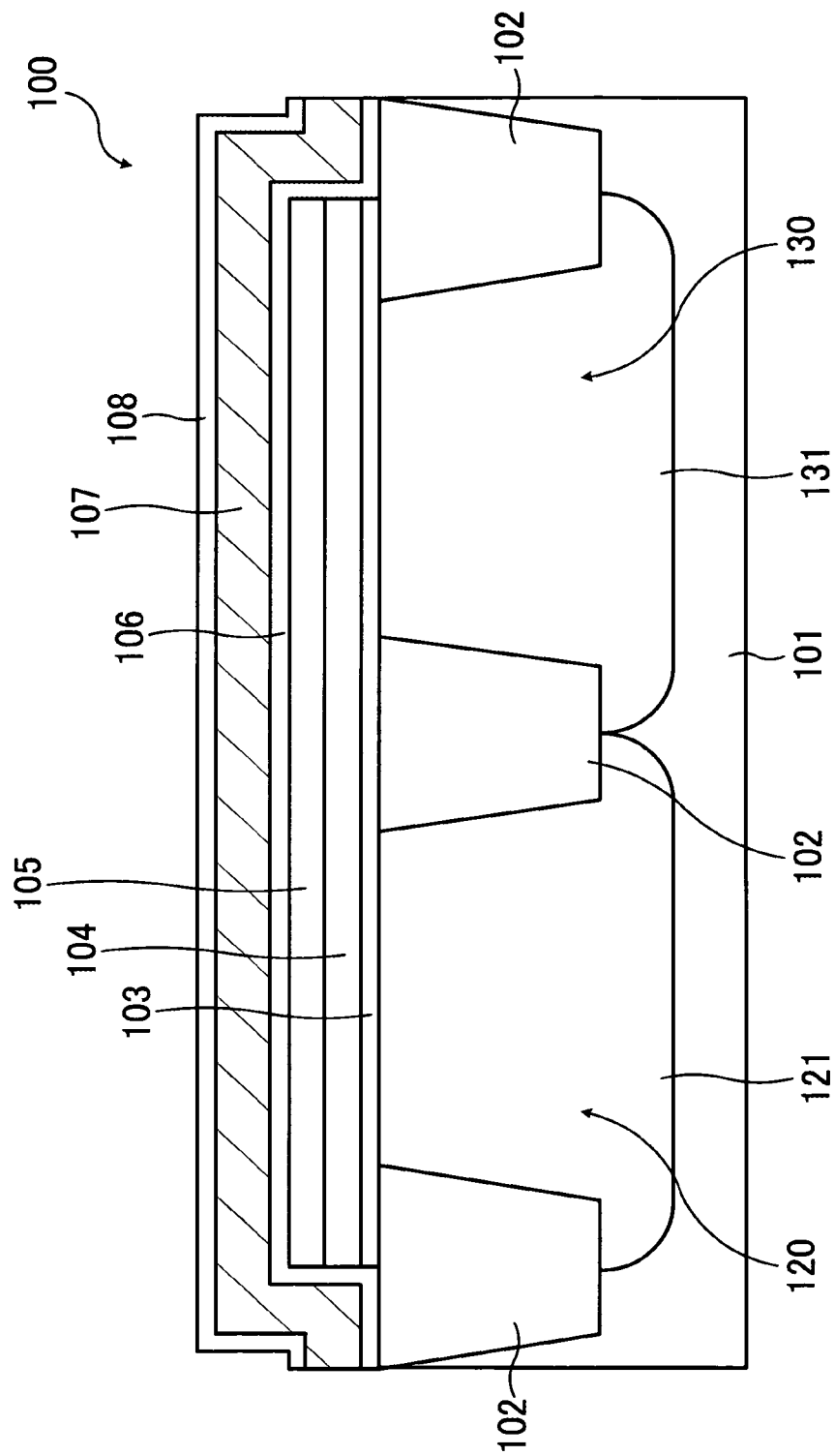
FIG. 37 is a schematic cross-sectional view of the essential portion of the CMOS structure in a stage in which a first stressing film and a second etching stopper film are formed.
Figure 38:
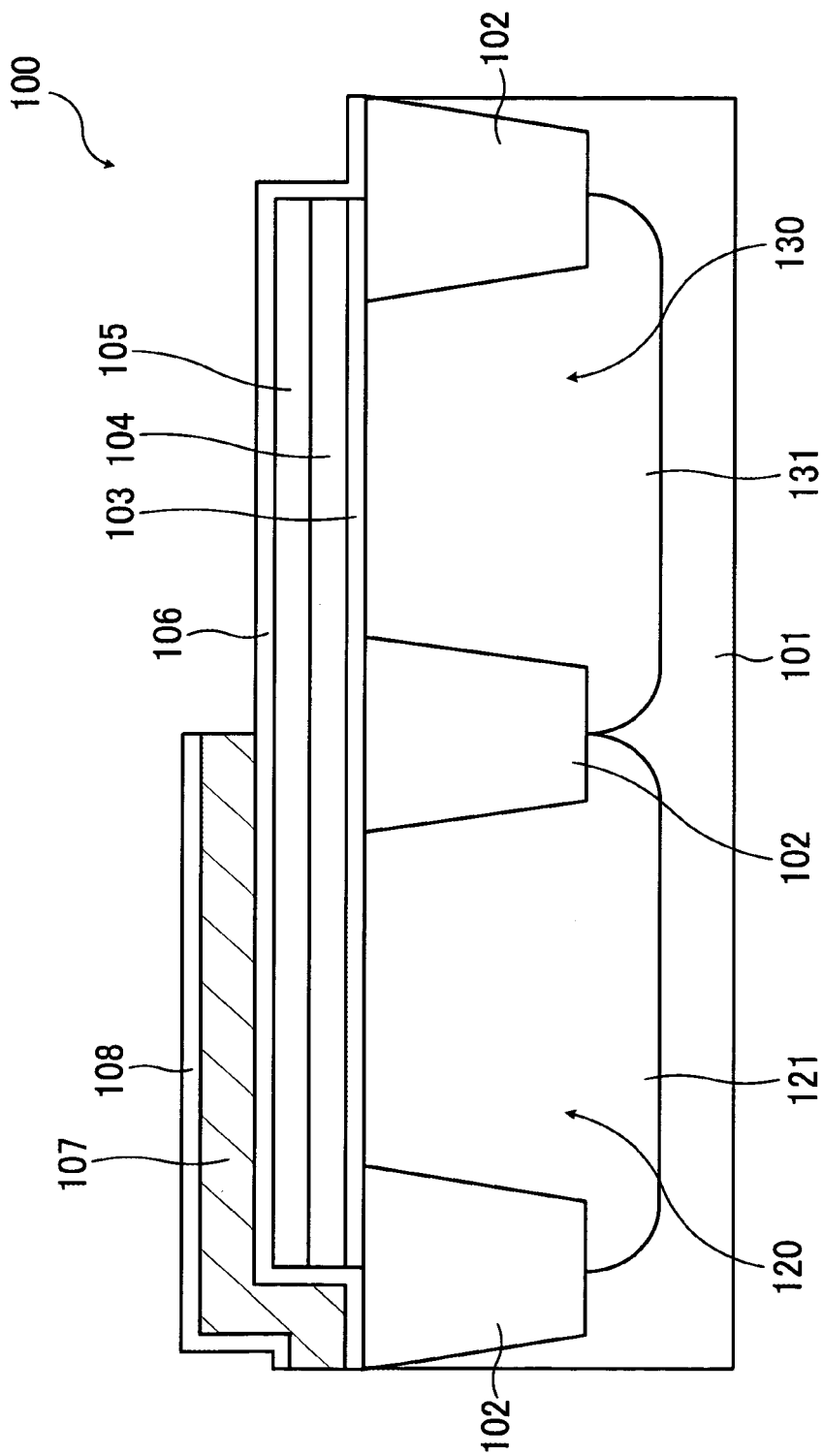
FIG. 38 is a schematic cross-sectional view of the essential portion of the CMOS structure in a first etching stage.
Figure 39:
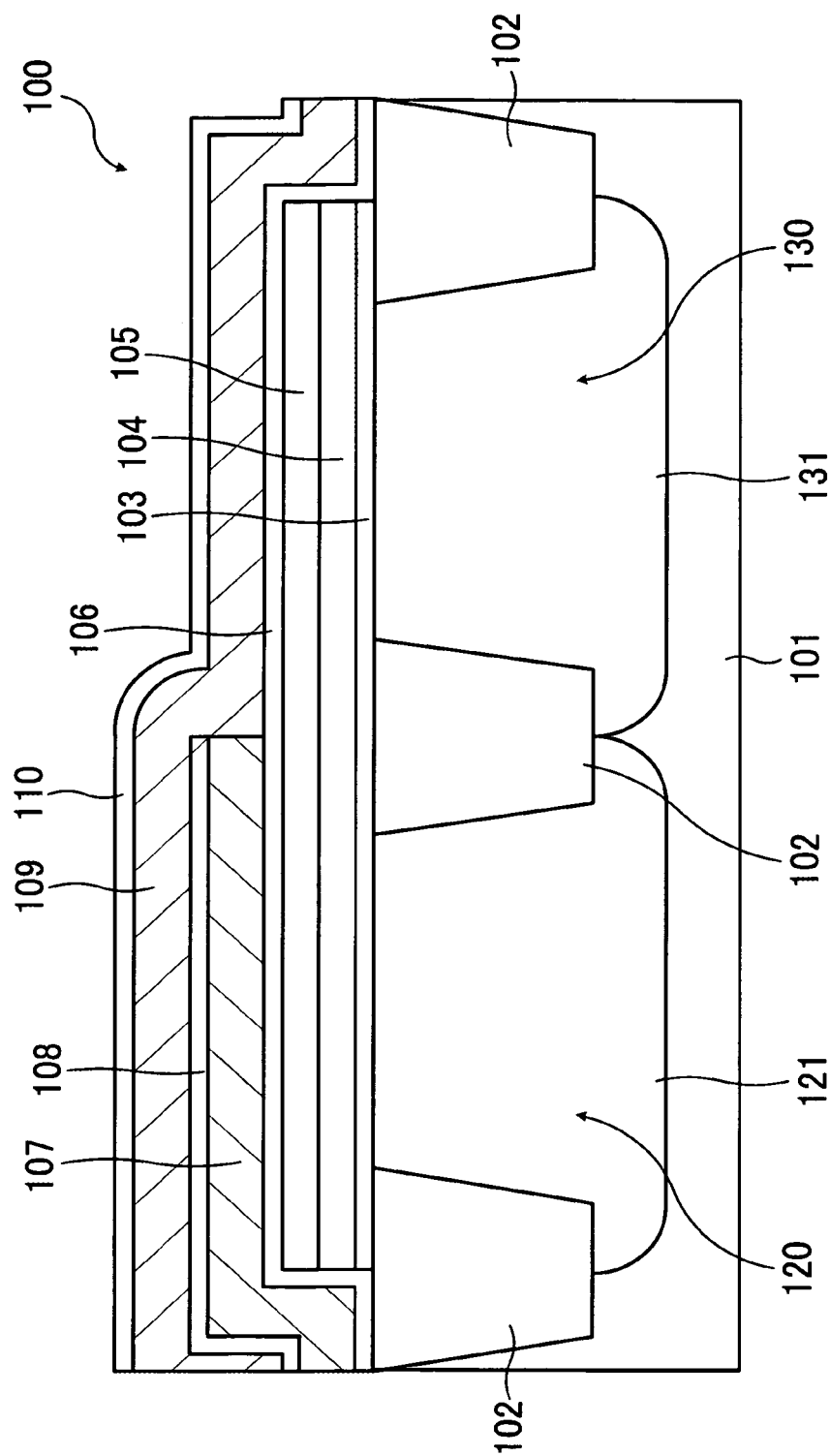
FIG. 39 is a schematic cross-sectional view of the essential portion of the CMOS structure in a stage in which a second stressing film and a third etching stopper film are formed.
Figure 40:
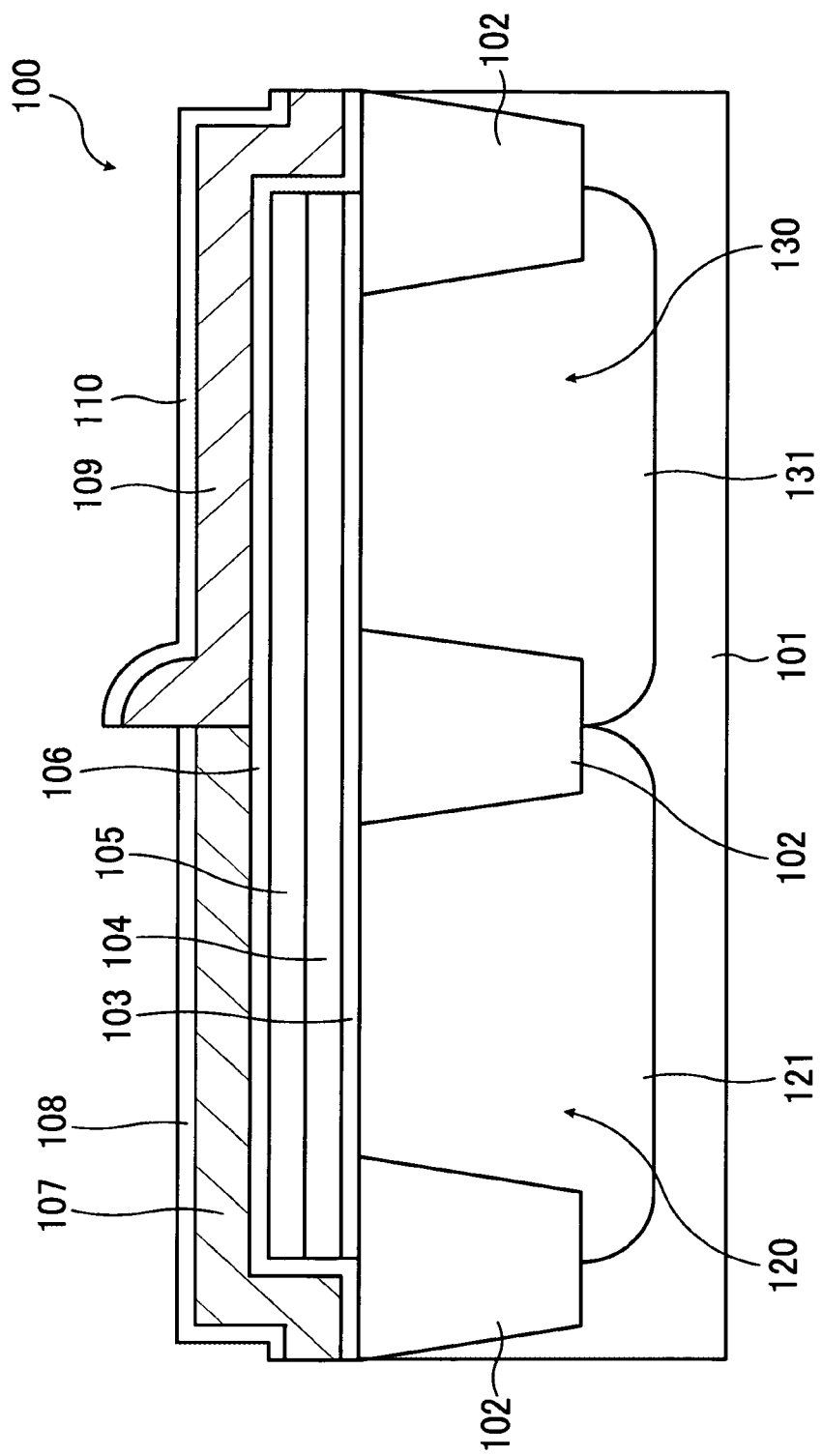
FIG. 40 is a schematic cross-sectional view of the essential portion of the CMOS structure in a second etching stage.
Figure 41:
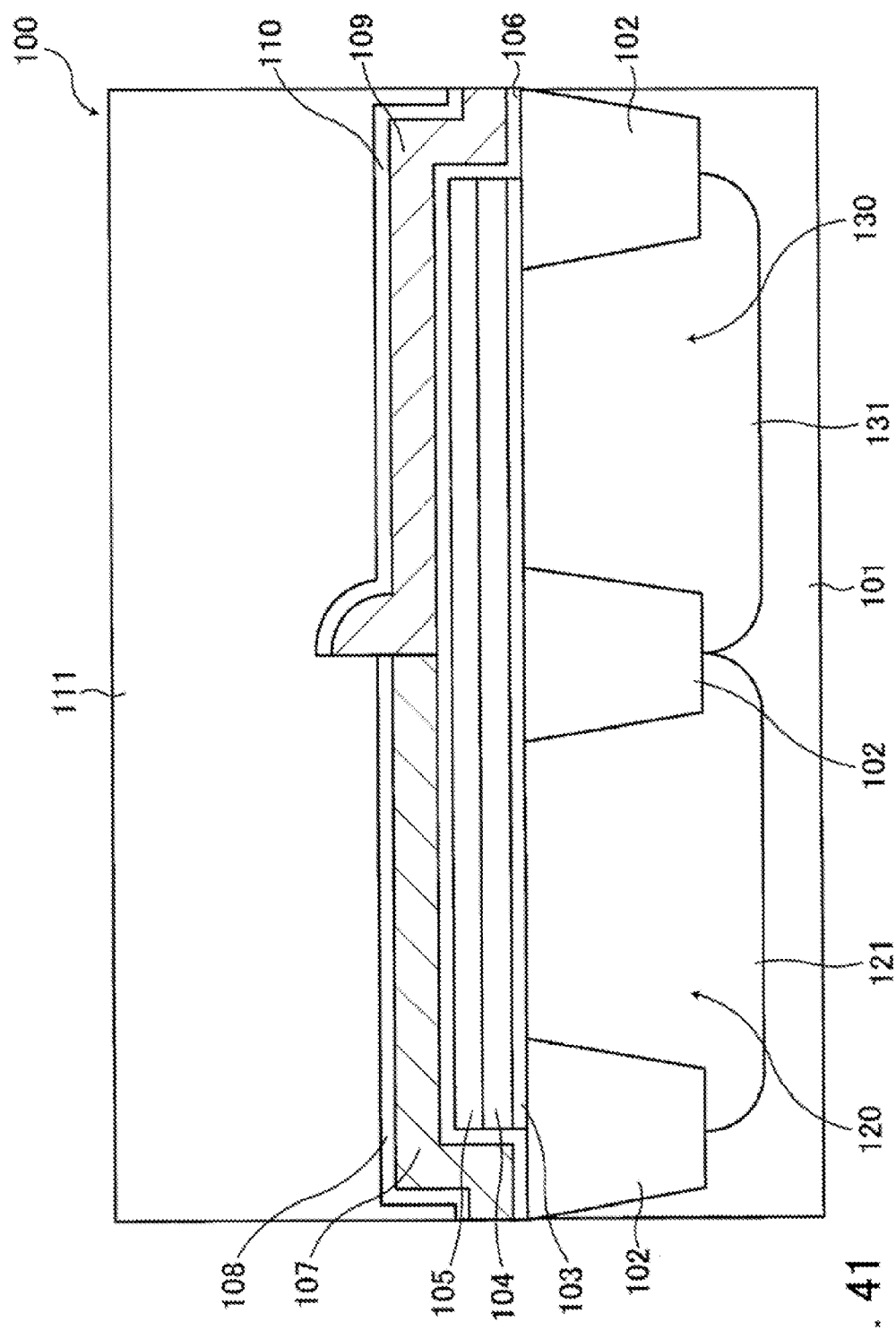
FIG. 41 is a schematic cross-sectional view of the essential portion of the CMOS structure in which an interlayer insulation film is formed.

In order to evaluate the effect of the isotropic etching, chain-contact structures based on the layouts of 18A to 33F have been produced, and electric characteristics of the chain-contact structures have been measured, so that a relationship between the layout and the yield rate has been obtained as indicated in FIG. 34, which is a graph indicating the obtained relationship between the layout and the yield rate. In FIG. 34, the abscissa indicates the width (in nanometers) of the overlap of stressing films in the contact-hole formation region, and the ordinate indicates the yield rate (%) of the chain-contact structure. In addition, the values of the widths of the overlap of stressing films in the chain-contact structures formed without use of the isotropic etching are used as the values of the widths of the overlap of stressing films in the corresponding chain-contact structures formed by use of the isotropic etching, respectively. Further, with respect to the width of the overlap in the contact-hole formation region, which is indicated on the abscissa, the width of overlap of two stressing films (first and second stressing films) in the contact-hole formation region is represented as a positive value, and a gap between the stressing films in the contact-hole formation region is represented as a negative value.

In the above measurement, three groups of samples X, Y, and W having chain-contact structures have been produced. In the processes for producing each of the three groups of samples X, Y, and W, a plurality of contact holes extending through one or more stressing films and being connected to a conductive region are formed by etching, and contact electrodes are formed in the plurality of contact holes. In the process for producing the first and second groups of samples X and Y, the second stressing film is etched by anisotropic etching. In addition, different types of anisotropic etching systems are used for the anisotropic etching in production of the first and second groups of samples X and Y.

As shown in FIG. 34, in the first and second groups of samples X and Y (which are produced without use of the isotropic etching in etching of the second stressing film), the yield rate is lowered when the widths of the overlap of the stressing films are great or when gaps exist between the stressing films. This is because the opening for the contact hole is likely to become insufficient when the stressing films are formed in two layers in a considerable portion of a cross section in the contact-hole formation region, and etching damage to the conductive region underlying the stressing films is likely to occur when the width of the gap between the first and second stressing films in the contact-hole formation region is great.

On the other hand, in the third groups of samples W (which are produced by use of the isotropic etching for removal of the second stressing film), the yield rate is high even when the stressing films overlap or are apart in the contact-hole formation region, i.e., the yield rate is approximately 100% regardless of the width of the overlap of or the gap between the stressing films. Since the isotropic etching reduces or eliminates the overlap of the near-edge portions of the two stressing films, it is possible to secure electric connection through the contact electrode even in the case the contact-hole formation region includes the boundary between the two stressing films, as in the case where the contact-hole formation region includes only one stressing film. In addition, even when the isotropic etching produces a gap between the stressing films or an indentation at the boundary between the stressing films, it is possible to suppress the etching damage to the conductive region underlying the stressing films and secure electric connection through the contact electrode as long as the gap is small or the indentation is not so deep as to pass through the stressing films.

Therefore, in the case where the isotropic etching is performed before formation of the contact hole, it is possible to achieve the advantages of the isotropic etching as explained above by appropriately determining the layout of the contact-hole formation region and the boundary between the stressing films, the portions of the stressing films to be removed by the isotropic etching, and the like on the basis of the findings as explained above.

Advantages of the Invention

As explained above by using the first to fifth embodiments, the contact hole for formation of the contact electrode can be formed according to one of the first, second, and third aspects of the present invention.

According to the first aspect of the present invention, a contact hole is formed through a layer in which first and second films of different types are dividedly formed, a portion of the layer is removed for formation of the contact hole so that the portion of the layer includes only the first film, only the second film, or both of a portion of the first film and a portion of the second film, and the portion of one of the first and second films occupies a major part of the portion of the layer. Therefore, it is possible to effectively suppress damage to a conductive region and suppress occurrence of failure in formation of an opening for the contact hole.

According to the second aspect of the present invention, the size of the contact hole is increased so that an opening of a sufficient size is formed through the total cross-sectional area of a portion of the layer other than the regions in which the thick portion of the second stressing film 5, the overlap of the first and second stressing films 4 and 5, or the gap between the first and second stressing films 4 and 5 exists.

According to the third aspect of the present invention, the contact hole is formed in the boundary region between the stressing films after the unevenness in the boundary region is reduced or eliminated by isotropic etching. Therefore, according to the third aspect of the present invention, the thick portion of a stressing film is flattened, and occurrence of failure in formation of the opening is suppressed.

Thus, according to one of the first, second, and third aspects of the present invention, it is possible to produce a semiconductor device having a low-resistance contact structure in which resistance increase is suppressed and connection failure is prevented.

In particular, when the first, second, and third aspects of the present invention are used in formation of contact structures in which stressing films are dividedly formed over different transistors, it is possible to realize high-performance semiconductor devices having a low-resistance contact structure.

The foregoing is considered as illustrative only of the principle of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A producing method of a semiconductor device, comprising:
    forming a first transistor and a second transistor in a first well of a first conductive type and a second well of a second conductive type, respectively, the first well and the second well being formed in a semiconductor substrate, the first transistor and the second transistor including a gate electrode successively formed over the first well and the second well;
    forming a first film and a second film over the first transistor and the second transistor, respectively, a boundary region between the first film and the second film being placed out of a boundary between the first well and the second well to the first well and placed over the first well of the first well and the second well;
    forming a contact hole placed out of the boundary region between the first film and the second film to the second film and extending to the gate electrode through the second film of the first film and the second film; and
    forming a contact electrode in the contact hole.

2. The producing method according to claim 1, wherein, the forming of the first film and the second film includes
    forming the first film over the first transistor and the second transistor,
    forming an etching stopper film on the first film,
    removing a first part of the etching stopper film on a first part of the first film and the first part of the first film by etching so as to leave a second part of the etching stopper film and a second part of the first film,
    forming the second film over a structure after removing the first part of the etching stopper film and the first part of the first film, and
    removing a first part of the second film formed over the second part of the etching stopper film by etching so as to leave a second part of the second film.

3. The producing method according to claim 1, wherein the contact hole is placed out of the boundary between the first well and the second well to the second well and is placed over the second well of the first well and the second well.

* * * * *